US008873299B2

(12) United States Patent
Kaneko et al.

(10) Patent No.: US 8,873,299 B2
(45) Date of Patent: Oct. 28, 2014

(54) SEMICONDUCTOR MEMORY DEVICE

(71) Applicant: Kabushiki Kaisha Toshiba, Tokyo (JP)

(72) Inventors: Mizuki Kaneko, Kanagawa (JP);
Takeshi Hioka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/784,638

(22) Filed: Mar. 4, 2013

(65) Prior Publication Data

US 2013/0301354 A1 Nov. 14, 2013

(30) Foreign Application Priority Data

May 11, 2012 (JP) ................................. 2012-109895

(51) Int. Cl.
*G11C 16/06* (2006.01)
*G11C 16/04* (2006.01)
*G11C 16/08* (2006.01)

(52) U.S. Cl.
CPC .......... *G11C 16/08* (2013.01); *G11C 16/0483* (2013.01)
USPC ................. 365/185.23; 365/185.11

(58) Field of Classification Search
CPC ..... G11C 16/0483; G11C 16/08; G11C 16/30
USPC ........................ 365/185.11, 185.23
See application file for complete search history.

(56) References Cited

U.S. PATENT DOCUMENTS

| 6,125,052 | A | * | 9/2000 | Tanaka ..................... 365/185.03 |
| 6,580,644 | B1 | * | 6/2003 | Chung ..................... 365/185.22 |
| 2001/0055223 | A1 | | 12/2001 | Iwahashi |
| 2003/0002352 | A1 | | 1/2003 | Kim |
| 2004/0027878 | A1 | | 2/2004 | Kim et al. |
| 2004/0125653 | A1 | * | 7/2004 | Tran et al. ................. 365/185.22 |
| 2005/0232013 | A1 | * | 10/2005 | Kawai et al. ............. 365/185.18 |
| 2006/0083091 | A1 | * | 4/2006 | Edahiro ........................ 365/203 |
| 2006/0202668 | A1 | * | 9/2006 | Tran et al. ..................... 323/215 |
| 2010/0128551 | A1 | * | 5/2010 | Tanzawa et al. ............. 365/226 |
| 2010/0157676 | A1 | * | 6/2010 | Isobe ........................ 365/185.11 |
| 2011/0157976 | A1 | * | 6/2011 | Kuriyama .................. 365/185.2 |
| 2011/0284946 | A1 | | 11/2011 | Kiyotoshi |
| 2012/0074923 | A1 | * | 3/2012 | Tran et al. ..................... 323/315 |

* cited by examiner

*Primary Examiner* — Hoai V Ho
*Assistant Examiner* — Yeuan-Ming Sheu
(74) *Attorney, Agent, or Firm* — Patterson & Sheridan, LLP

(57) ABSTRACT

A semiconductor memory device includes memory cells and a voltage generating circuit for generating a voltage for memory cells. The first voltage generating circuit includes a first diode connected between first and second nodes, a first transistor connected between the output terminal and a third node and having a gate connected to the second node, a second transistor connected between the third node and a fourth node and having a gate connected to the second node, a third transistor connected between the output terminal and the first node and having a gate connected to the fourth node, a second diode connected between the first and fourth nodes, and a charge pump circuit configured to supply a voltage to the fourth node. The first voltage generating circuit functions to adjust the generated voltage when it overshoots a desired value which may be caused by capacitive coupling with adjacent wirings.

20 Claims, 13 Drawing Sheets

SEMICONDUCTOR MEMORY DEVICE

CROSS-REFERENCE TO RELATED APPLICATION(S)

This application is based upon and claims the benefit of priority from Japanese Patent Application No. 2012-109895, filed on May 11, 2012, the entire contents of which are incorporated herein by reference.

FIELD

Embodiments described in the present disclosure relate to a semiconductor memory device.

BACKGROUND

A NAND flash memory is a well known semiconductor memory device that can store data in a non-volatile manner with high capacity. A cell array of the NAND flash memory is constructed by arranging a NAND cell unit, which includes a plurality of memory cells connected in series.

In the NAND flash memory, parasitic capacitance between word lines increases when memory device features are miniaturized and storage density is increased. Consequently, when a desired voltage is applied to a selected word line, an overshoot of the voltage in the selected word line may occur due to capacitive coupling caused by a change of voltage in an adjacent word line. When the overshoot occurs, a reasonable time delay until the voltage settles down to the desired level is required, causing a reduction in device performance as writing/reading speeds may be decreased. This delay becomes particularly obvious in a NAND flash memory where memory cells are arrayed in three dimensions.

DETAILED DESCRIPTION

The present disclosure describes a semiconductor memory device that can more quickly bring a wiring line voltage to a desired level and can thereby enhance device performance. Embodiments are explained below with reference to the figures.

A semiconductor memory device according to an embodiment includes memory cells and a voltage generating circuit for generating a voltage for memory cells. The first voltage generating circuit includes a first diode connected between first and second nodes, a first transistor connected between the output terminal and a third node and having a gate connected to the second node, a second transistor connected between the third node and a fourth node and having a gate connected to the second node, a third transistor connected between the output terminal and the first node and having a gate connected to the fourth node, a second diode connected between the first and fourth nodes, and a charge pump circuit configured to supply a voltage to the fourth node.

The first voltage generating circuit functions to adjust the generated voltage when it overshoots a desired value which may be caused by capacitive coupling with adjacent wirings.

Hereafter, the embodiments of the non-volatile semiconductor memory device relating to the embodiments are explained with reference to the drawings.

[First Embodiment]

Figure 1:
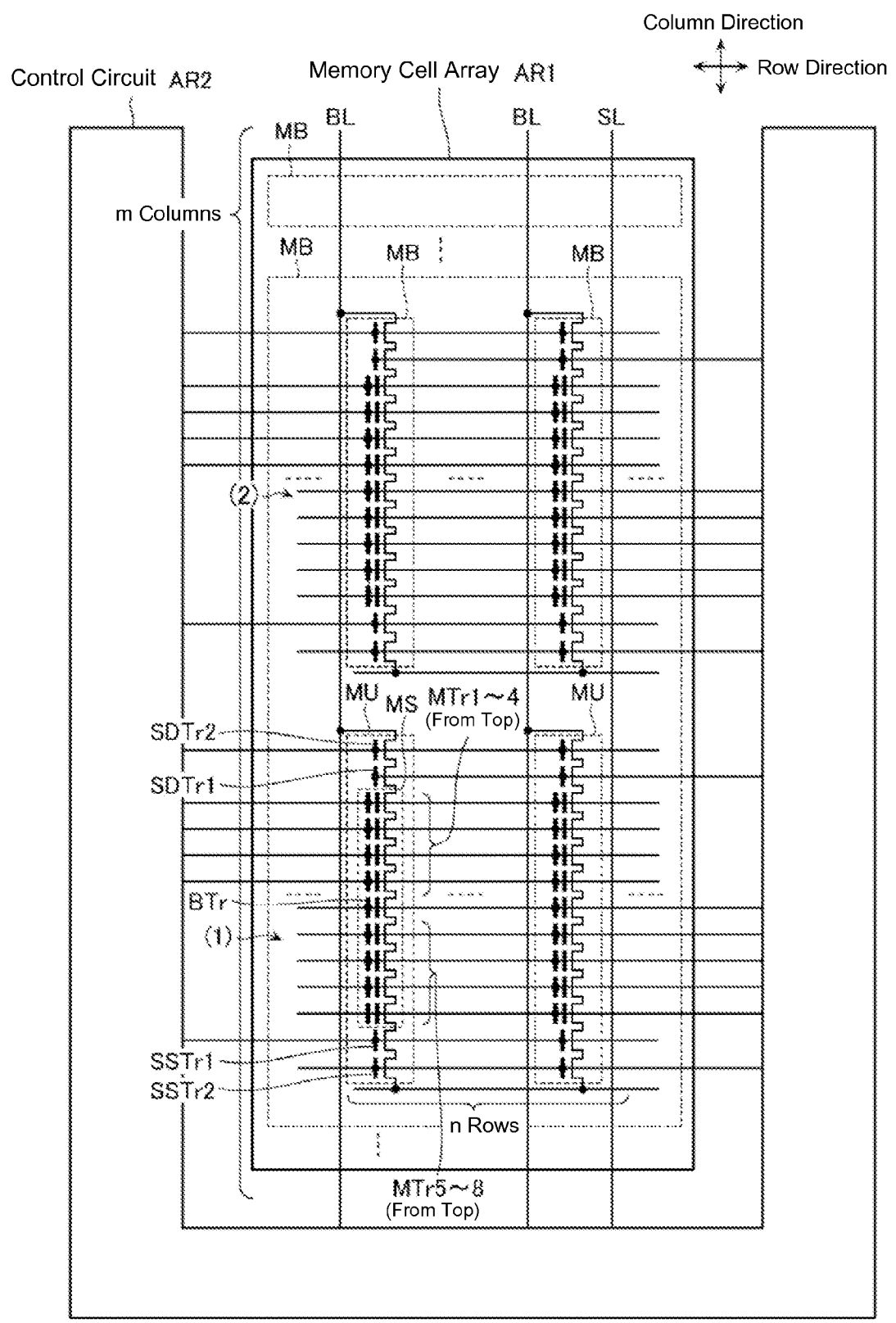
FIG. 1 is a circuit diagram of a non-volatile semiconductor memory device according to a first embodiment.

First, with reference to FIG. 1, an entire construction of the non-volatile semiconductor memory device relating to the first embodiment is explained. FIG. 1 is a circuit diagram of the non-volatile semiconductor memory device relating to the first embodiment.

As shown in FIG. 1, the non-volatile semiconductor memory device relating to the first embodiment has a memory cell array AR1 and a control circuit AR2 established around its periphery.

The memory cell array AR1, as shown in FIG. 1, is constructed by arraying a plurality of memory strings MS where electrically-rewritable memory transistors MTr1 to MTr8 (memory cells) are series-connected. The control circuit AR2 is composed of various control circuits that control voltage, which is provided to gates and the like of the memory transistors MTr (MTr1 to MTr8). The control circuit AR2 executes an operation to write data into the memory transistors MTr, an operation to erase data in the memory transistors MTr, and an operation to retrieve data from the memory transistors MTr. On the occasion of the writing operation and the read operation (retrieval operation), a voltage that is applied to a selected memory string MS is approximately the same as that for a conventional laminated flash memory.

The memory cell array AR1, as shown in FIG. 1, has m columns of memory blocks MB. Each memory block MB has n rows and 2 columns of memory units MU. The memory unit MU includes the memory string MS, a first source-side selection transistor SSTr1 and a second source-side selection transistor SSTr2 that are series-connected to the source side of the memory string MS, a first drain-side selection transistor SDTr1 and a second drain-side selection transistor SDTr2 that are series-connected to the drain-side of the memory string MS. Herein, two sets of the drain-side selection transistors and the source-side selection transistors are placed in one memory string MS is illustrated as one example, but the present disclosure is not limited to this example, and one set of the drain-side selection transistor and the source-side selection transistor may be placed in one memory string MS. Furthermore, in the examples shown in FIG. 1, the first column of the memory unit MU is indicated as (1), and the second column is indicated as (2). In each memory block MB, two memory units MU aligned in the column direction share a bit line BL. Further, in each memory block MB, n memory units MU aligned in the row direction share a word line, a selected gate line, a source line, and a back gate line. The bit line BL and the source line SL are shared by m columns of memory blocks MB.

Figure 2:
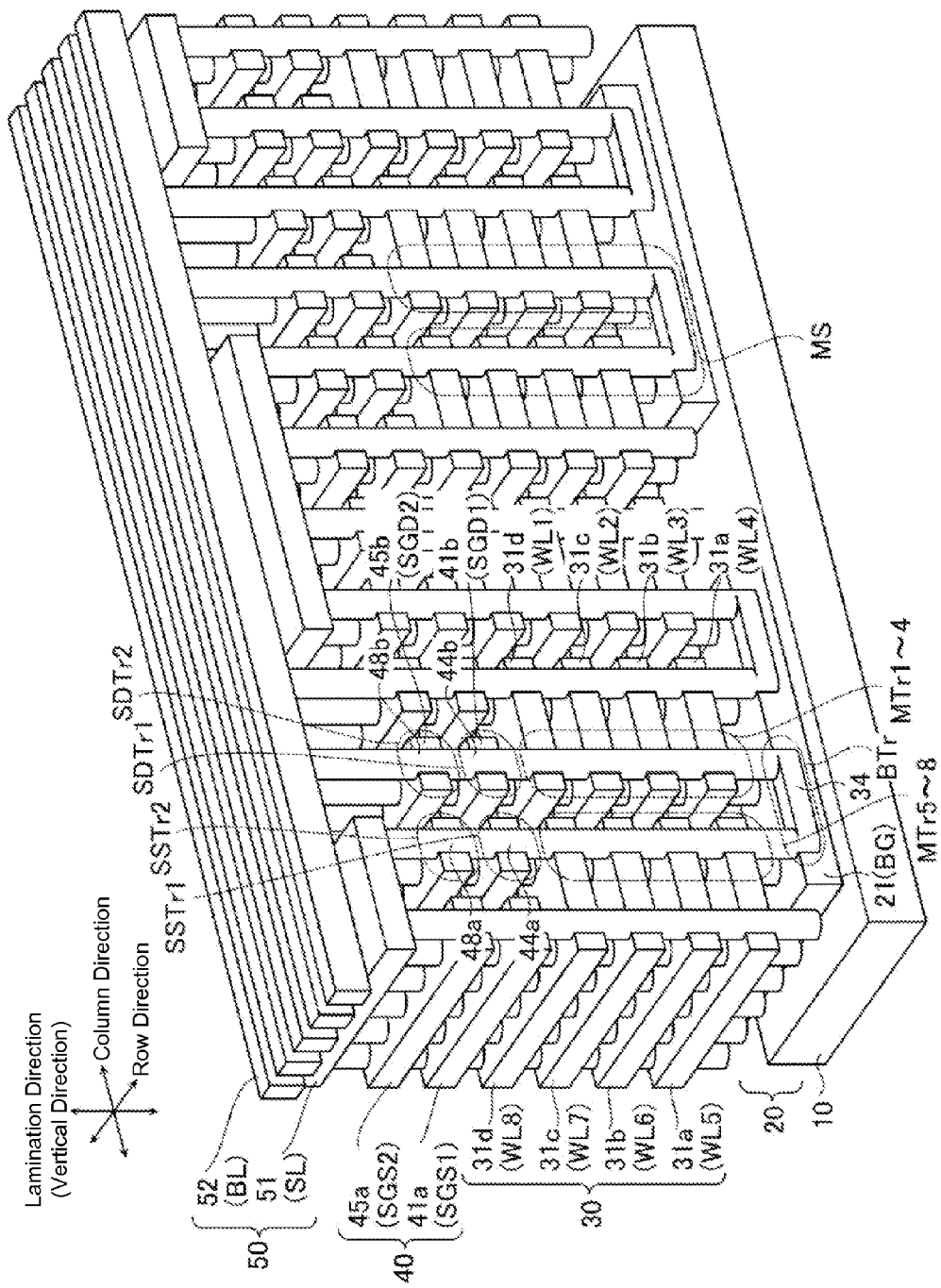
FIG. 2 is a perspective view depicting a laminated structure of a memory cell array of the first embodiment.

The memory cell array AR1, as shown in FIG. 2, is constructed by arraying the memory transistors MTr that electrically store data in a three-dimensional matrix manner. In other words, the memory transistors MTr are arrayed to be matrix in the horizontal direction, and in the lamination direction (the vertical direction with regard to a substrate), as well. A plurality of memory transistors MTr1 to MTr8 aligned in the lamination direction are series-connected, and constitute the memory string MS. The first and second drain-side selection transistors SDTr1 and SDTr2, and the first and second source-side selection transistors SSTr1 and SSTr2 that become in the conduction state at the time of being selected are connected to both sides of the memory string MS, respectively. This memory string MS is arrayed by regarding the lamination direction as a longitudinal direction. Furthermore, a detailed laminated structure will be described later.

Figure 3:
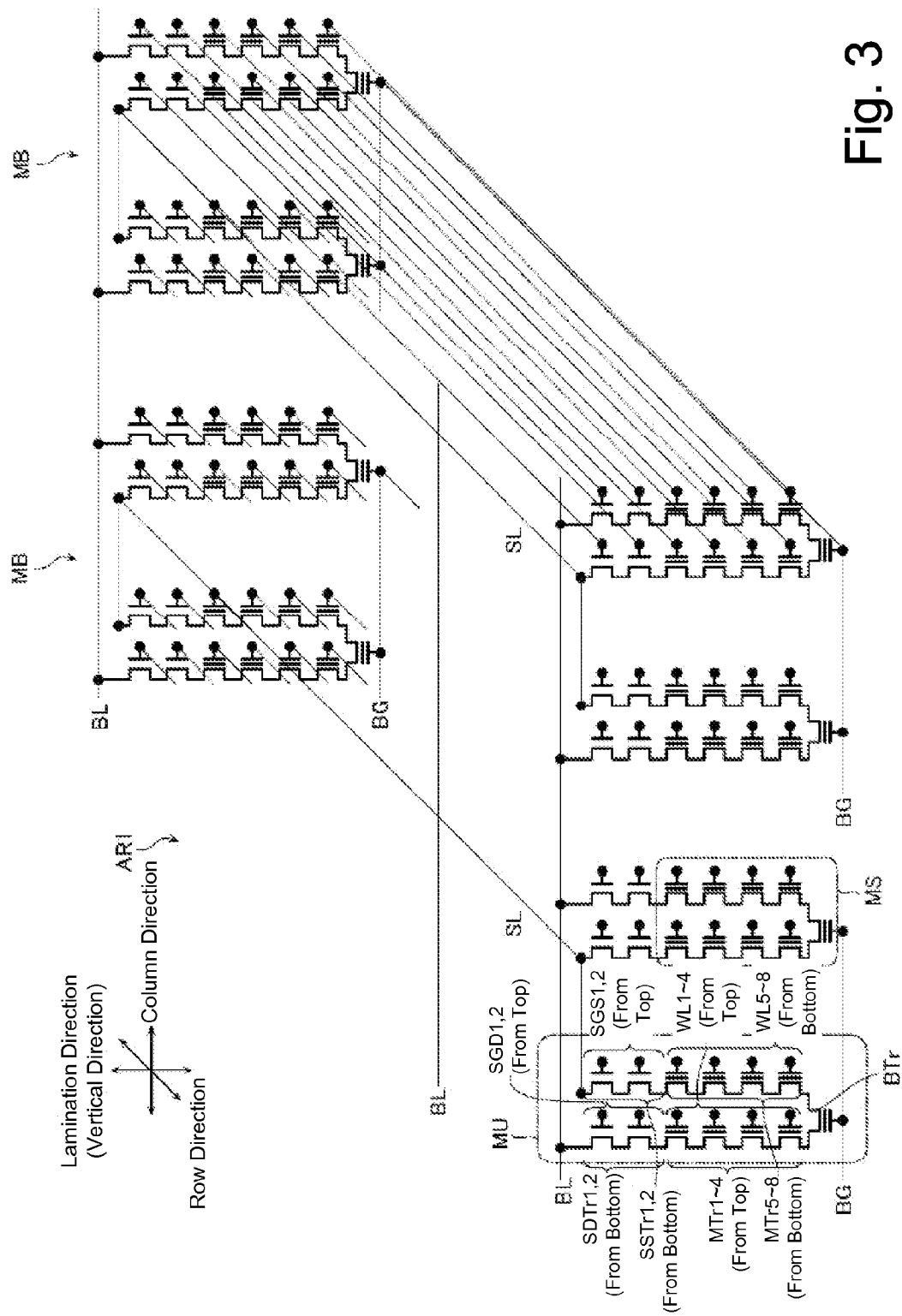
FIG. 3 is circuit diagram of the memory cell array.

Next, circuit configuration of the memory cell array AR1 is specifically explained with reference to FIG. 3. FIG. 3 is an equivalent circuit diagram of the memory cell array AR1.

The memory cell array AR1, as shown in FIG. 3, has a plurality of bit lines BL and a plurality of memory blocks MB. The bit lines BL are arrayed in the row direction at predetermined intervals, and are formed to be stripe extending by regarding the column direction as a longitudinal direction. The memory block MB is repeatedly placed in the column direction at predetermined intervals.

The memory block MB, as shown in FIG. 3, has a plurality of memory units MU arrayed to be matrix in the row direction and the column direction. In the memory block MB, a plurality of commonly-connected memory units MU are placed in one bit line BL. The memory unit MU has the memory string MS, the first source-side selection transistor SSTr1, the second source-side selection transistor SSTr2, the first drain-side selection transistor SDTr1 and the second drain-side selection transistor SDTr2. The memory units MU are arrayed to be matrix in the row direction and the column direction.

The memory string MS is composed of series-connected memory transistors MTr1 to MTr8 and the back gate transistor BTr. The memory transistors MTr1 to MTr4 are series-connected in the lamination direction. The memory transistors MTr5 to MTr8 are also series-connected in the lamination direction. In the memory transistors MTr1 to MTr8, the threshold voltage is changed because a quantity of electric charges that are accumulated in their charge accumulation layers. Data retained in the memory transistors MTr1 to MTr8 is rewritten by changing the threshold voltage, respectively. The back gate transistor BTr is connected between the memory transistor MTr4 and the memory transistor MTr5 in the lowermost layer. Therefore, the memory transistors MTr1 to MTr8 and the back gate transistor BTr are connected to be U-shaped in a cross section along the column direction. A drain of the first source-side selection transistor SSTr1 is connected to one end of the memory string MS (a source of the memory transistor MTr8). A drain of the second source-side selection transistor SSTr2 is connected to a source of the first source-side selection transistor SSTr2. A source of the first drain-side selection transistor SDTr1 is connected to the other end of the memory string MS (a drain of the memory transistor MTr1). A source of the second drain-side selection transistor SDTr2 is connected to a drain of the first drain-side selection transistor SDTr1. These transistors SSTr1, SSTr2 SDTr1 and SDTr2 have different threshold voltage because a quantity of electric charges that are accumulated in each charge accumulation layer is changed.

Gates of n memory transistors MTr1 arrayed in a line in the row direction are commonly connected to a single word line WL1 extending in the row direction. Similarly, gates of n memory transistors MTr2 to MTr8 arrayed in a line in the row direction are commonly connected to respective one of word lines WL2 to WL8 extending in the row direction. Further, gates of (2×n) back gate transistors BTr arrayed in a matrix manner in the row direction and in the column direction are commonly connected to a back gate line BG.

Gates of n first source-side selection transistors SSTr1 arrayed in a line in the row direction are commonly connected to a single first source-side selection gate line SGS1 extending in the row direction. Similarly, gates of n second source-side selection transistors SSTr2 arrayed in a line in the row direction are commonly connected to a single second source-side gate line SGS2 extending in the row direction. Further, a source of the second side selection transistor SSTr2 is connected to the source line SL extending in the row direction.

Gates of n first drain-side selection transistors SDTr1 arrayed in a line in the row direction are commonly connected to a single first drain-side selection gate line SGD1 extending in the row direction. Gates of n second source-side selection transistors SDTr2 arrayed in a line in the row direction are commonly connected to a single second drain-side selection gate line SGD2 extending in the row direction. Further, a drain of the second drain-side selection transistor SDTr2 is connected to the bit line BL extending in the column line.

Figure 4:
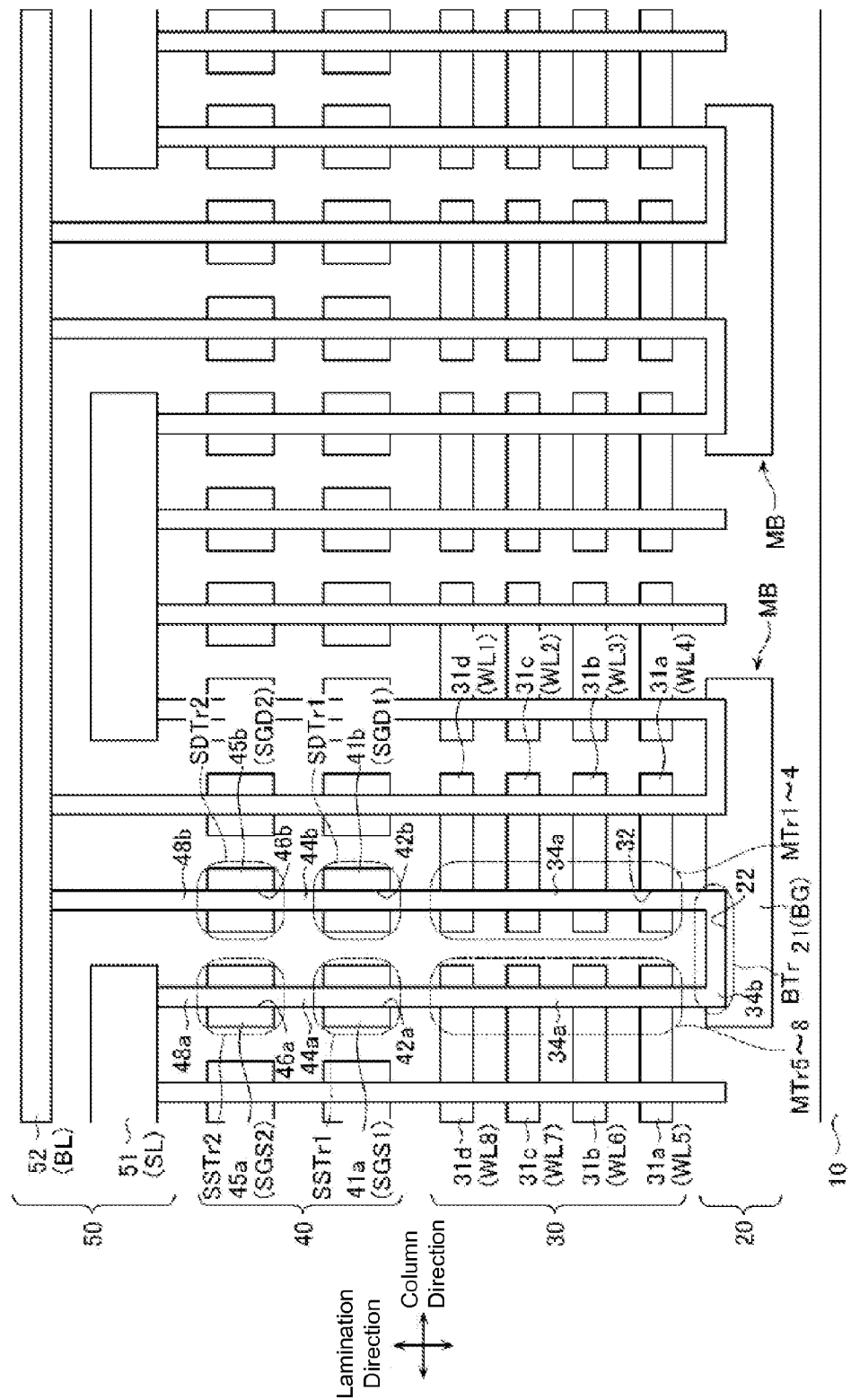
FIG. 4 is a cross-sectional view of the memory cell array.
Figure 5:
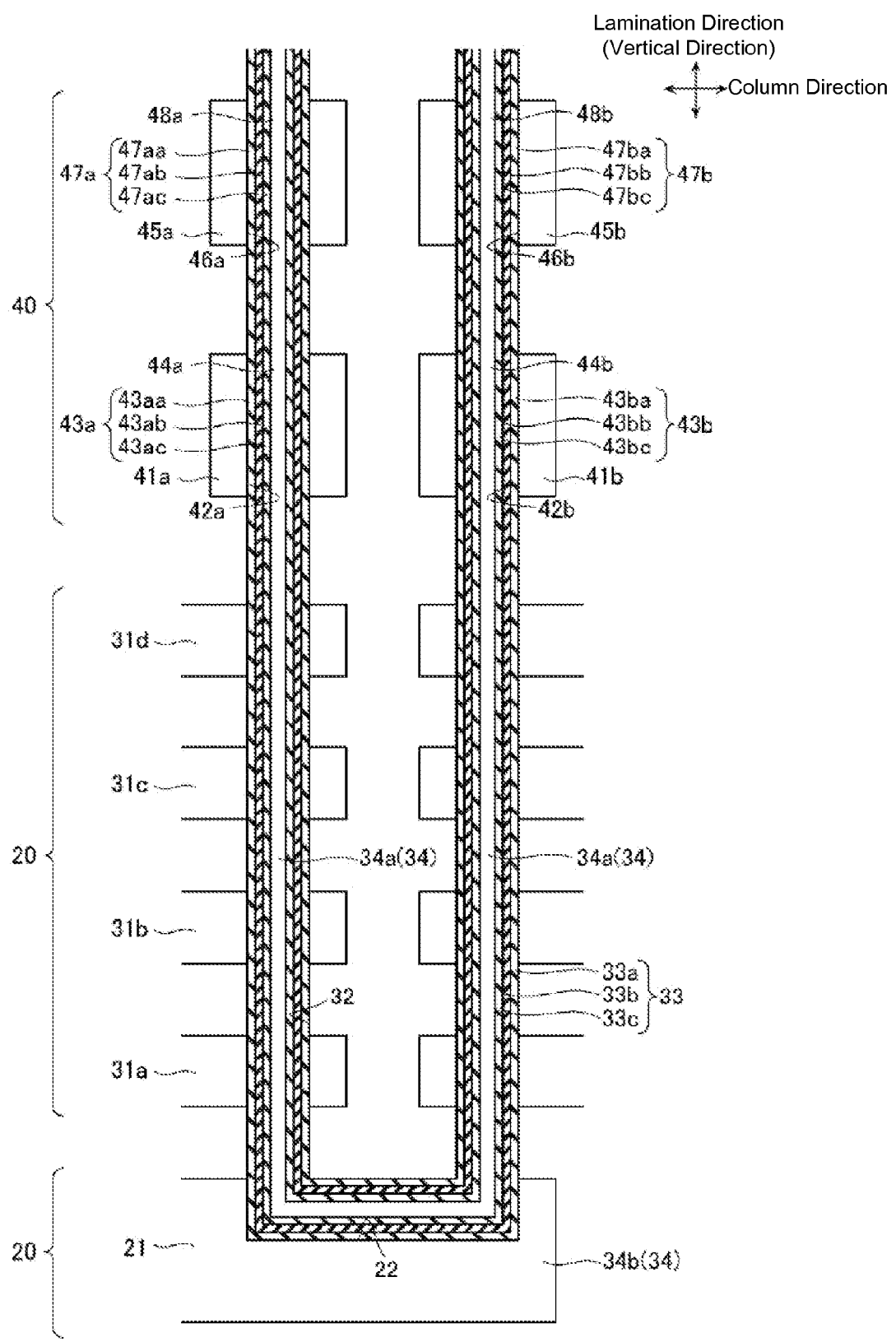
FIG. 5 is a partially enlarged view of FIG. 4

Next, the laminated structure of the non-volatile semiconductor memory device relating to the first embodiment is explained with reference to FIG. 4 and FIG. 5. FIG. 4 is a cross-sectional view of the memory cell array AR1, and FIG. 5 is a partially-enlarged view of FIG. 4.

The memory cell array AR1, as shown in FIG. 4, has a back gate transistor layer 20, a memory transistor layer 30, a selection transistor layer 40 and a wiring layer 50 on a substrate 10. The back gate transistor layer 20 functions as the back gate transistor BTr. The memory transistor layer 30 functions as the memory transistors MTr1 to MTr8 (memory strings MS). The selection transistor layer 40 functions as the first source-side selection transistor SSTr1, the second source-side selection transistor SSTr2, the first drain-side selection transistor SDTr1 and the second drain-side selection transistor SDTr2. The wiring layer 50 functions as the source line SL and the bit line BL.

The back gate transistor layer 20, as shown in FIG. 4, has a back gate conductive layer 21. The back gate conductive layer 21 functions as the back gate line BG, and, functions as a gate of the back gate transistor BTr.

The back gate conductive layer 21 is formed so as to two-dimensionally extend in the row direction, which is in parallel to the substrate 10, and in the column direction. The back gate conductive layer 21 is divided per memory block MB. The back gate conductive layer 21 comprises polysilicon (poly-Si).

The back gate conductive layer 20, as shown in FIG. 4, has a back gate hole 22. The back gate hole 22 is formed so as to engrave the back gate conductive layer 21. The back gate hole 22 is formed to be roughly rectangular by regarding the column direction as a longitudinal direction from the upper surface. The back gate hole 22 is formed in a matrix manner in the row direction and in the column direction.

The memory transistor layer 30, as shown in FIG. 4, is formed in the upper layer of the back gate conductive layer 20. The memory transistor layer 30 has word line conductive layers 31a to 31d. The word line conductive layers 31a to 31d function as the word lines WL1 to WL8, respectively, and, function as the gates of the memory transistors MTr1 to MTr8.

The word line conductive layer 31a to 31d are laminated by sandwiching an interlayer insulation layer (not shown), respectively. The word line conductive layers 31a to 31d are formed at predetermined intervals in the column direction and so as to extend by the row direction as a longitudinal direction. The word line conductive layers 31a to 31d comprise polysilicon (poly-Si).

The memory transistor layer 30, as shown in FIG. 4, has a memory hole 32. The memory hole 32 is formed so as to penetrate through the word line conductive layers 31a to 31d and not-shown interlayer insulation layers. The memory hole 32 is formed so as to fit together in the vicinity of the end portion of the back gate hole 22 in the column direction.

Further, the back gate transistor layer 20 and the memory transistor layer 30, as shown in FIG. 5, have a memory gate insulation layer 33 and a memory semiconductor layer 34. The memory semiconductor layer 34 functions as a body for the memory transistors MTr1 to MTr8 (memory string MS).

The memory gate insulation layer 33, as shown in FIG. 5, is formed on the side surfaces of the back gate hole 22 and the memory hole 32 with predetermined thickness. The memory gate insulation layer 33 has a block insulation layer 33a, a charge accumulation layer 33b and a tunnel insulation layer 33c. Threshold voltage of the memory transistors MTr1 to MTr8 is changed by accumulating charges in the charge accumulation layer 33b, and this results in rewriting of data retained in the memory transistors MTr.

The block insulation layer 33a, as shown in FIG. 5, is formed on the side surfaces of the back gate hole 22 and the memory hole 32 with predetermined thickness. The charge accumulation layer 33b is formed on the side surface of the block insulation layer 33a with predetermined thickness. The tunnel insulation layer 33c is formed on the side surface of the charge accumulation layer 33b with predetermined thickness. The block insulation layer 33a and the tunnel insulation layer 33c comprise silicon oxide ($SiO_2$). The charge accumulation layer 33b comprises silicon nitride (SiN).

The memory semiconductor layer 34 is formed so as to make contact with the side surface of the tunnel insulation layer 33c. The memory semiconductor layer 34 is formed so as to fill the back gate hole 22 and the memory hole 33. The memory semiconductor layer 34 is formed to be U-shaped viewing from the row direction. The memory semiconductor layer 34 includes a pair of columnar parts 34a extending in the vertical direction with regard to the substrate 10, and a joining section 34b that joins lower ends of the pair of the columnar parts 34a. The memory semiconductor layer 34 comprises polysilicon (poly-Si).

To describe the construction of the back gate transistor layer 20 in the other words, the memory gate insulation layer 33 is formed so as to surround the joining section 34b. The back gate conductive layer 21 is formed so as to surround the joining section 34b via the memory gate insulation layer 33. Further, to describe the construction of the memory transistor layer 30 in the other words, the memory gate insulation layer 33 is formed so as to surround the columnar parts 34a. The word line conductive layers 31a to 31d are formed so as to surround the columnar parts 34a via the memory gate insulation layer 33.

The selection transistor layer 40, as shown in FIG. 4, has the first source-side conductive layer 41a and the first drain-side conductive layer 41b. The first source-side conductive layer 41a functions as the first source-side selection gate line SGS1, and, functions as a gate of the first source-side selection transistor SSTr1. The first drain-side conductive layer 41b functions as the first drain-side selection gate line SGD1, and, functions as a gate of the first drain-side selection transistor SDTr1.

The first source-side conductive layer 41a is formed in the upper layer of one columnar part 34a constituting the memory semiconductor layer 34, and a first drain-side conductive layer 41b is the same layer as the first source-side conductive layer 41a and is formed in the upper layer of the other columnar part 34a constituting the memory semiconductor layer 34. The first source-side conductive layer 41a and the first drain-side conductive layer 41b are formed in a stripe-state manner at predetermined intervals in the column direction and extending in the row direction. The first source-side conductive layer 41a and the first drain-side conductive layer 41b comprise polysilicon (poly-Si).

The selection transistor layer 40, as shown in FIG. 4, includes a first source-side hole 42a and a first drain-side hole 42b. The first source-side hole 42a is formed so as to penetrate through the first source-side conductive layer 41a. The first drain-side hole 42b is formed so as to penetrate through the first drain-side conductive layer 41b. The first source-side hole 42a and the first drain-side hole 42b are formed at a position to fit together with the memory hole 32, respectively.

The selection transistor layer 40, as shown in FIG. 5, includes a first source-side gate insulation layer 43a, a first source-side columnar semiconductor layer 44a, a first drain-side gate insulation layer 43b, and a first drain-side columnar semiconductor layer 44b. The first source-side columnar semiconductor layer 44a functions as a body of the first source-side selection transistor SSTr1. The first drain-side columnar semiconductor layer 44b functions as a body of the first drain-side columnar semiconductor layer SDTr1.

The first source-side gate insulation layer 43a is formed on the side surface of the first source-side hole 42a with predetermined thickness. The first source-side gate insulation layer 43a has a block insulation layer 43aa, a charge accumulation layer 43ab and a tunnel insulation layer 43ac. The charge accumulation layer 43ab is a layer having a function to accumulate electric charges.

The block insulation layer 43aa, as shown in FIG. 5, is formed on the side surface of the first source-side hole 43a with predetermined thickness. The block insulation layer 43aa is formed continuously and integrally with the block insulation layer 33a. The charge accumulation layer 43ab is formed on the side surface of the block insulation layer 43aa with predetermined thickness. The charge accumulation layer 43ab is formed continuously and integrally with the charge accumulation layer 33b. The tunnel insulation layer 43ac is formed on the side surface of the charge accumulation layer 43ab with predetermined thickness. The tunnel insulation layer 43ac is formed continuously and integrally with the tunnel insulation layer 33c. The block insulation layer 43aa and the tunnel insulation layer 43ac comprise silicon oxide ($SiO_2$). The charge accumulation layer 43ab comprises silicon nitride (SiN).

The first source-side columnar semiconductor layer 44a makes contact with the side surface of the first source-side gate insulation layer 43a and the upper surface of the one of the pair of the columnar parts 34a, and is formed to be columnar so as to extend in the vertical direction with regard to the substrate 10. The first source-side columnar semiconductor layer 44a is formed so as to fill the first source-side hole 42a. The first source-side columnar semiconductor layer 44a is formed continuously and integrally with the columnar parts 34a. The first source-side columnar semiconductor layer 44a comprises polysilicon (poly-Si).

The first drain-side gate insulation layer 43b is formed on the side surface of the first drain-side hole 42b with predetermined thickness. The first drain-side gate insulation layer 43b has a block insulation layer 43ba, a charge accumulation layer 43bb and a tunnel insulation layer 43bc. The charge accumulation layer 43bb changes threshold voltage of the first drain-side selection transistor SDTr1 by accumulating electric charges.

The block insulation layer 43ba, as shown in FIG. 5, is formed on the side surface of the first drain-side hole 43b with a predetermined thickness. The block insulation layer 43ba is formed continuously and integrally with the block insulation layer 33a. The charge accumulation layer 43bb is formed on the side surface of the block insulation layer 43ba with a predetermined thickness. The block insulation layer 43bb is formed continuously and integrally with the block insulation layer 33b. The tunnel insulation layer 43bc is formed on the side surface of the charge accumulation layer 43bb with a predetermined thickness. The block insulation layer 43bc is formed continuously and integrally with the block insulation layer 33c. The block insulation layer 43ba and the tunnel insulation layer 43bc comprise silicon oxide ($SiO_2$). The charge accumulation layer 43bb comprises silicon nitride (SiN).

The first drain-side columnar semiconductor layer 44b makes contact with the side surface of the first drain-side gate insulation layer 43b and the upper surface of the other of the pair of the columnar parts 34a, and is formed to be columnar so as to extend in the vertical direction with regard to the substrate 10. The first drain-side columnar semiconductor layer 44b is formed so as to fill the first drain-side hole 42b. The first drain-side columnar semiconductor layer 44b is formed continuously and integrally with the columnar part 34a. The first drain-side columnar semiconductor layer 44b comprises polysilicon (poly-Si).

Further, the selection transistor layer 40, as shown in FIG. 4, includes a second source-side conductive layer 45a and a second drain-side conductive layer 45b. The second source-side conductive layer 45a functions as a second source-side gate line SGS2, and functions as a gate of the second source-side selection transistor SSTr2. The second drain-side conductive layer 45b functions as a second drain-side selection gate line SGD2, and functions as a gate of the second drain-side selection transistor SDTr2.

The second source-side conductive layer 45a is formed in the upper layer of the first source-side conductive layer 41a. The second drain-side conductive layer 45b is the same layer as the second source-side conductive layer 45a, and is formed in the upper layer of the first drain-side conductive layer 41b. The second source-side conductive layer 45a and the second drain-side conductive layer 45b comprises polysilicon (poly-Si).

The selection transistor layer 40, as shown in FIG. 4, has a second source-side hole 46a and a second drain-side hole 46b. The second source-side hole 46a is formed so as to penetrate through the second source-side conductive layer 45a. The second source-side hole 46a is formed at a position to fit together with the first source-side hole 42a. The second drain-side hole 46b is formed so as to penetrate through the second drain-side conductive layer 45b. The second drain-side hole 46b is formed at a position to fit together with the first drain-side hole 42b.

The selection transistor layer 40, as shown in FIG. 5, includes a second source-side gate insulation layer 47a, a second source-side columnar semiconductor layer 48a, a second drain-side gate insulation layer 47b and a second drain-side columnar semiconductor layer 48b. The second source-side columnar semiconductor layer 48a functions as a body of the second source-side selection transistor SSTr2. The second drain-side columnar semiconductor layer 48b functions as a body of the second drain-side columnar semiconductor layer SDTr2.

The second source-side gate insulation layer 47a is formed on the side surface of the second source-side hole 46a with a predetermined thickness. The second source-side gate insulation layer 47a has a block insulation layer 47aa, a charge accumulation layer 47ab and a tunnel insulation layer 47ac. The charge accumulation layer 47ab changes threshold voltage of the second source-side selection transistor SSTr2 by accumulating electric charges.

The block insulation layer 47aa, as shown in FIG. 5, is formed on the side surface of the second source-side hole 46a with a predetermined thickness. The block insulation layer 47aa is formed continuously and integrally with the block insulation layer 43aa. The charge accumulation later 47ab is formed on the side surface of the block insulation layer 47aa with a predetermined thickness. The tunnel insulation layer 47ab is formed continuously and integrally with the tunnel insulation layer 43ab. The tunnel insulation layer 47ac is formed on the side surface of the charge insulation layer 47ab with a predetermined thickness. The tunnel insulation layer 47ac is formed continuously and integrally with the tunnel insulation layer 43ac. The block insulation layer 47aa and the tunnel insulation layer 47ac comprise silicon oxide ($SiO_2$). The charge accumulation layer 47ab comprises silicon nitride (SiN).

The second source-side columnar semiconductor layer 48a makes contact with the side surface of the second source-side game insulation layer 47a and the upper surface of the first source-side columnar semiconductor layer 44a, and is formed to be columnar so as to extend in the vertical direction with regard to the substrate 10. The second source-side columnar semiconductor layer 48a is formed so as to fill the second source-side hole 46a. The second source-side columnar semiconductor layer 48a is formed continuously and integrally with the first source-side columnar semiconductor layer 44a. The second source-side columnar semiconductor layer 48a comprises polysilicon (poly-Si).

The second drain-side gate insulation layer 47b is formed on the side surface of the second drain-side hole 46b with predetermined thickness. The second drain-side gate insulation layer 47b has a block insulation layer 47ba, a charge accumulation layer 47bb and a tunnel insulation layer 47bc. The charge accumulation layer 47bb changes threshold voltage of the second drain-side selection transistor SDTr2 by accumulating electric charges.

Thus, the drain-side selection transistors SDTr1, SDTr2, SSTr1 and SSTr2 have the charge accumulation layers 43ab, 43bb, 47ab and 47bb as similar to the memory transistor MTr, and are constructed so as to enable to change the threshold voltage by changing a quantity of electric charges that are accumulated in the charge accumulation layers. Originally, the selection transistors do not have to have such charge accumulation layers. However, from the viewpoint of manufacturing cost reduction, these selection transistors may also have the charge accumulation layers. In other words, in the case of forming a gate insulation layer where only the selection transistors do not have any charge accumulation layers, the number of processes is increased and the increase in the manufacturing cost cannot be avoided. Though omitted from the illustrations, after the conductive layers 31a to 31d and the conductive layers 41a, 41b, 45a and 45b and not shown interlayer insulation layers sandwiched between them are laminated, a U-shaped hole(s) is formed, and a silicon oxide film, a silicon nitride film (a charge accumulation layer) and a silicon oxide film are deposited sequentially on the wall surface, and a structure as shown in FIG. 5 is obtained.

However, when a gate insulation layer of the selection transistor has a charge accumulation layer, in the writing operation or the reading operation from/into a memory cell, an electron hole(s) or electrons happens to be trapped in the charge accumulation layer of the selection transistor, and this may cause the fluctuation of threshold voltage of the selection transistor involuntarily. Consequently, in the present embodiment, the control circuit AR2 is configured so as to enable to execute adjustment operation (writing operation) of the threshold voltage to the selection transistors.

The block insulation layer 47ba, as shown in FIG. 5, is formed on the side surface of the second drain-side hole 46b with predetermined thickness. The block insulation layer 47ba is formed continuously and integrally with the block insulation layer 43ba. The charge accumulation layer 47bb is formed on the side surface of the block insulation layer 47ba with a predetermined thickness. The charge accumulation layer 47bb is formed continuously and integrally with the charge accumulation layer 43bb. The tunnel insulation layer 47bc is formed on the side surface of the charge accumulation layer 47bb with a predetermined thickness. The tunnel insulation layer 47bc is formed continuously and integrally with the tunnel insulation layer 43bc. The block insulation layer 47ba and the tunnel insulation layer 47bc are comprises silicon oxide ($SiO_2$). The charge accumulation layer 47bb comprises silicon nitride (SiN).

The second drain-side columnar semiconductor layer 48b makes contact with the side surface of the second drain-side gate insulation layer 47b and the upper surface of the first drain-side columnar semiconductor layer 44b, and is formed to be columnar so as to extend in the vertical direction with regard to the substrate 10. The second drain-side columnar semiconductor layer 48b is formed so as to fill the first drain-side hole 46b. The second drain-side columnar semiconductor layer 48b is formed continuously and integrally with the first drain-side columnar semiconductor layer 44b. The second rain-side columnar semiconductor layer 48b comprises polysilicon (poly-Si).

To describe the construction of the selection transistor layer 40 in the other words, the first source-side gate insulation layer 43a is formed so as to surround the first source-side columnar semiconductor layer 44a. The first source-side conductive layer 41a is formed so as to surround the first source-side columnar semiconductor layer 44a via the first source-side gate insulation layer 43a. The first drain-side gate insulation layer 43b is formed so as to surround the first drain-side columnar semiconductor layer 44b. The first drain-side conductive layer 41b is formed so as to surround the first drain-side columnar semiconductor layer 44b via the first drain-side gate insulation layer 43b.

Further, to describe the construction of the selection transistor layer 40 in other words, the second source-side gate insulation layer 47a is formed so as to surround the second source-side columnar semiconductor layer 48a. The second source-side conductive layer 45a is formed so as to surround the second source-side columnar semiconductor layer 48a via the second source-side gate insulation layer 47a. The second drain-side gate insulation layer 47b is formed so as to surround the second drain-side columnar semiconductor layer 48b. The second drain-side conducive layer 45b is formed so as to surround the second drain-side columnar semiconductor layer 48b via the second drain-side gate insulation layer 47b.

The wiring layer 50, as shown in FIG. 4, is formed in the upper layer of the selection transistor layer 40. The wiring layer 50 includes a source line layer 51 and a bit line layer 52. The source line layer 51 functions as the source line SL. The bit line layer 52 functions as the bit line BL.

The source line layer 51 is formed to be plate-state extending in the row direction. The source line layer 51 is formed so as to make contact with the upper surface of a pair of second source-side columnar semiconductor layer 48a, which are adjacent in the column direction. The bit line layer 52 makes contact with the upper surface of the second drain-side columnar semiconductor layer 48b, and is formed to be stripe-state at predetermined intervals in the row direction and extending in the column direction. The source line layer 51 and the bit line layer 52 comprise metal, such as tungsten (W) and the like.

Figure 6:
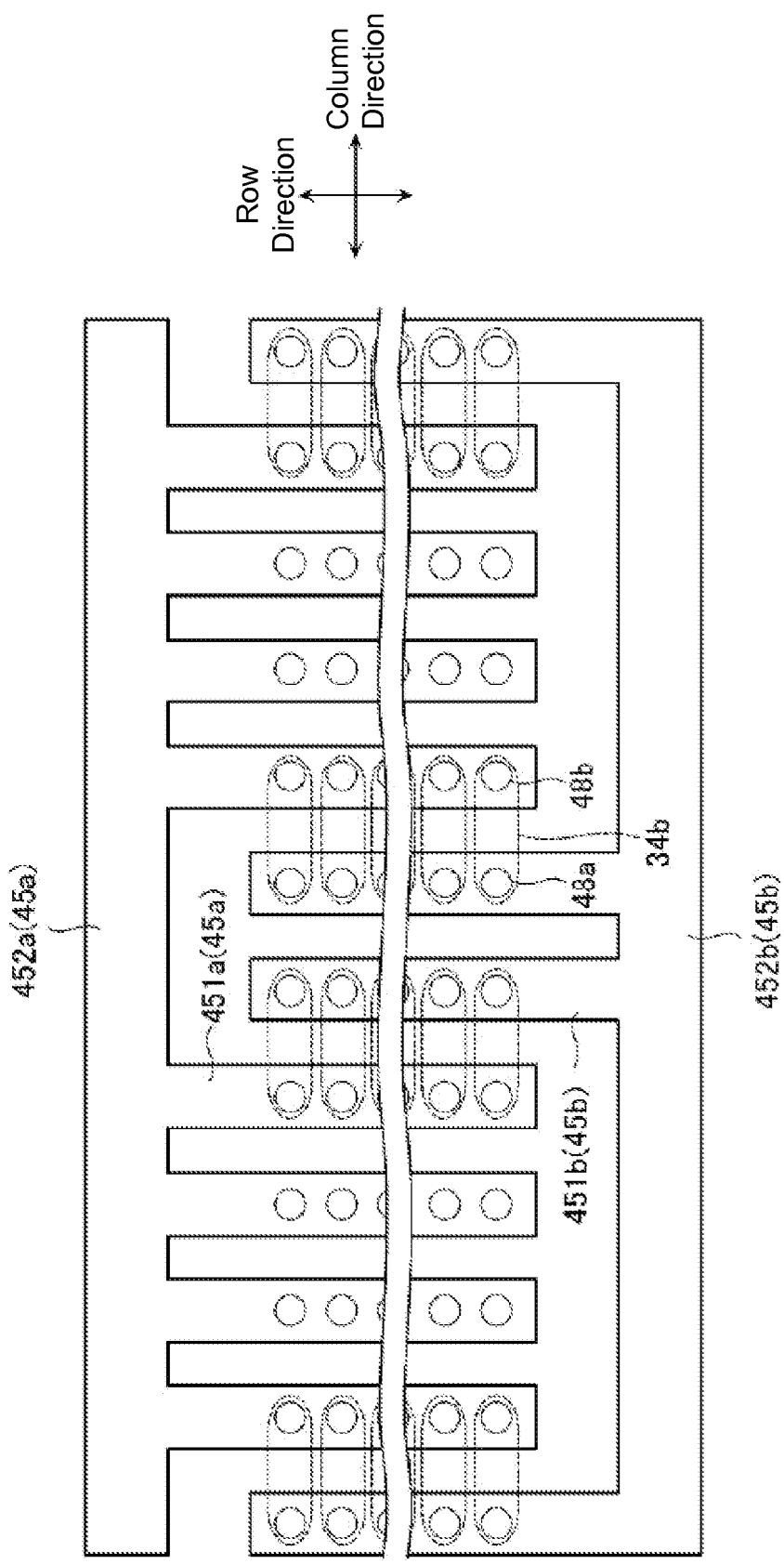
FIG. 6 is a top view showing a source-side conductive layer and a drain-side conductive layer.

Next, with reference to FIG. 6, the shapes of the second source-side conductive layer 45a and the second drain-side conductive layer 45b are explained in detail. FIG. 6 is a top view showing the second source-side conductive layer 45a and the second drain-side conductive layer 45b.

The second source-side conductive layer 45a and the second drain-side conductive layer 45b, as shown in FIG. 6, are formed to be ctenidium-like (comb-like structure) as viewed from the vertical direction, respectively. The second source-side conductive 45a includes a plurality of straight lines 451a that surround a plurality of the second source-side columnar semiconductor layers 48a standing aligned in the row direction, and a straight line 452a that joins end portions of the plurality of the straight parts 451a. Similarly, the second drain-side conductive layer 45b includes a plurality of straight parts 451b that surround a plurality of drain-side columnar semiconductor layers 48b aligned in the row direction and a straight part 452b that joins ends of the plurality of the straight parts 451b. As shown in FIG. 6, four straight parts 451a and two straight parts 451b are alternately placed in the column direction.

Figure 7:
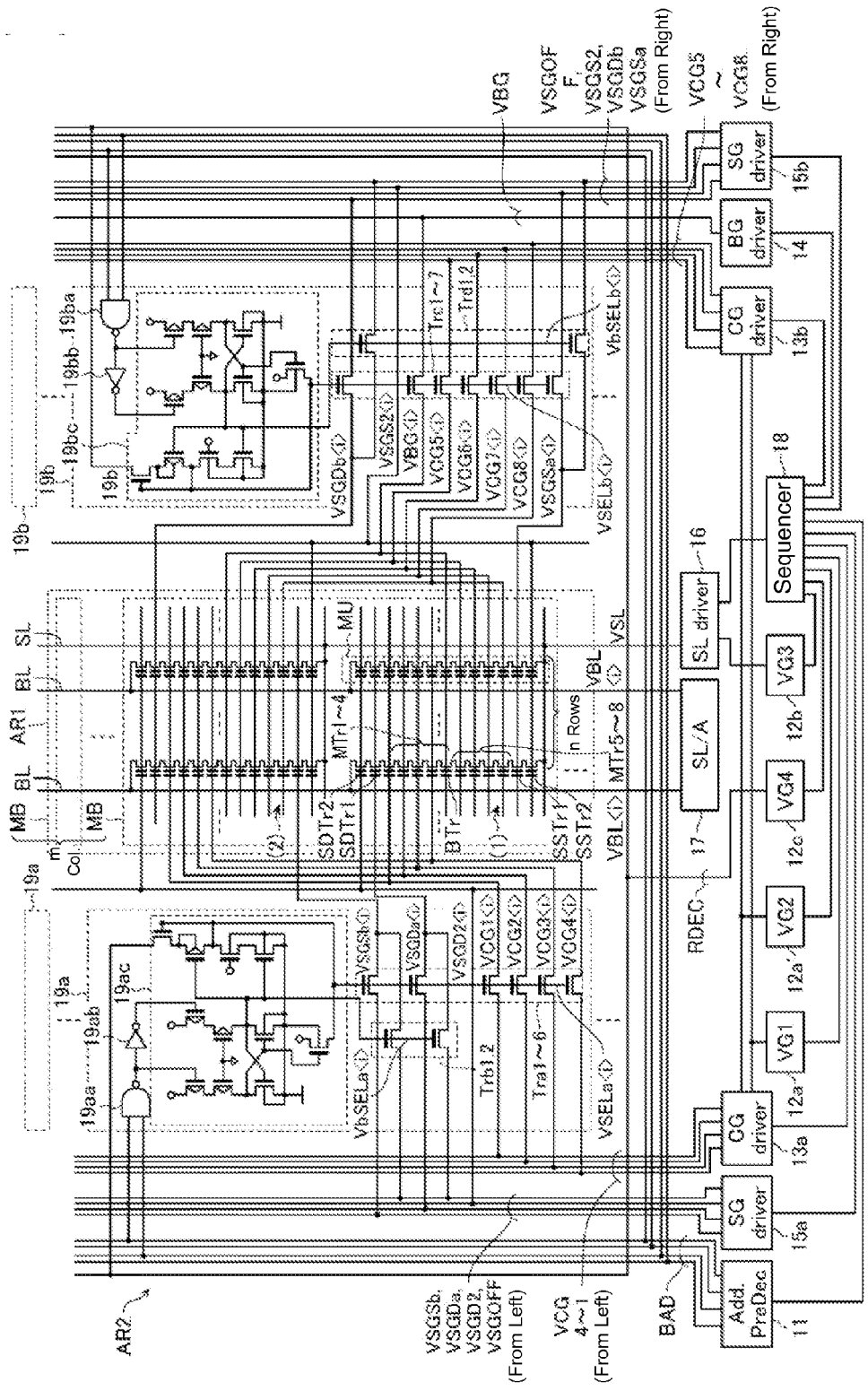
FIG. 7 is a circuit diagram showing a configuration of a control circuit.

Next, with reference to FIG. 7, a configuration of the control circuit AR2 is explained. FIG. 7 is a circuit diagram showing a specific configuration of the control circuit AR2. The control circuit AR2, as shown in FIG. 7, has an address decoder circuit 11, voltage generating circuits 12a, 12a', 12b and 12c, word line drive circuits 13a and 13b, a back gate line drive circuit 14, selection gate line drive circuits 15a and 15b, a source line drive circuit 16, a sense amplifier circuit 17, a sequencer 18 and row decoder circuits 19a and 19b.

The address decoder circuit 11, as shown in FIG. 7, outputs a signal BAD to the row decoder circuits 19a and 19b. The signal BAD is a signal for designating a memory block MB (block address).

The voltage generating circuits 12a, 12a', 12b and 12c generate raised voltage or lowered voltage by raising reference voltage or lowering the reference voltage or the raised reference voltage. The voltage generating circuit 12a (VG1) and the voltage generating circuit 12a' (VG2), as shown in FIG. 7, transfer the raised voltage to the word line drive circuits 13a and 13b. The voltage generating circuits 12a and 12a' are for generating different voltage from each other, and hereafter, as one example, it is explained that the former is for generating voltage that is supplied to a selected word line, and the latter is for generating voltage that is supplied to a non-selected word line. For example, in the case of the read operation, the voltage generating circuit 12a generates read voltage (retrieval voltage) $V_{CGRV}$, and the voltage generating circuit 12a' generates read pass voltage $V_{read}$ that is applied to the non-selected word line. The read voltage $V_{CGRV}$ is voltage between upper and lower limits of a plurality of threshold voltage distributions, and the read pass voltage $V_{read}$ is voltage that is greater than the upper limit of the maximum threshold voltage distribution. In contrast, in the case of the writing operation, the voltage generating circuit 12a generates program voltage $V_{pgm}$ (for example 20 V or greater) that is applied to the selected word line, and the voltage generating circuit 12a' generates writing pass voltage $V_{pass}$ (approximately 8 to 10 V) that is applied to a non-selected word line. The writing voltage $V_{pgm}$ is a sufficient level to generate a tunnel electric current where electrons are injected into a floating gate of the memory cell, when 0 V is provided to a channel. In the meantime, the writing pass voltage $V_{pass}$ conducts the memory cell, but that is insufficient to inject electrons to a floating gate even if 0 V is provided to a channel. Furthermore, it is also possible to establish another circuit that supplies voltage to another word line WL separately from the voltage circuits 12a and 12a'.

Further, the voltage generating circuit 12b (VG3) outputs a raised voltage to the source line drive circuit 16. The voltage generating circuit 12c (VG4) outputs the raised signal RDEC to the row decoder circuits 19a and 19b.

The word line drive circuit 13a, as shown in FIG. 7, outputs signals VCG1 to VCG4. The word line drive circuit 13b outputs signals VCG5 to VCG8. The signals VCG1 to VCG8 are used for driving the word lines WL1 to WL8 of the selected memory block MB<i>.

The back gate line drive circuit 14, as shown in FIG. 7, outputs a signal VBG. The signal VBG is used for driving the back gate line BG of the selected memory block MB<i>.

The selection gate line drive circuit 15a, as shown in FIG. 7, outputs signals VSGSb, VSGDa, VSGD2 and VSGOFF. The selection gate line drive circuit 15b outputs signals VSGSa, VSGDb, VSGS2 and VSGOFF. The signals VSGSa and VSGSb are used for driving the first source-side selection gate line SGS1 in the first and second columns of the selected memory block MB<i>, respectively. The signals VSGDa and VSGDb are used for driving the first drain-side selection gate line SGD1 in the first and second columns of the selected memory block MB<i>, respectively. The signal VSGS2 is used for driving the second source-side selection gate line SGS2 of the selected memory block MB<i>. The signal VSGD2 is used for driving the second drain-side selection gate line SGD2 of the selected memory block MB<i>. The signal VSGOFF is used for driving the first source-side selection gate line SGS1 and the first drain-side selection gate line SGD1 of the non-selected memory block MB<i>.

Herein, the signals VSGSb, VSGDa and VSGOFF are inputted into various wirings from the selection gate line drive circuit 15a via the row decoder circuit 19a. On the other hand, the signal VSGD2 is inputted into a gate of the second drain-side selection transistor SDTr2 from the selection gate line drive circuit 15a as a signal VSDG2<i>. Further, the signals VSGOFF, VSGDb and VSGSa are inputted into various wirings from the selection gate line drive circuit 15b via the row decoder circuit 19b. On the other hand, the signal VSGS2 is inputted into a gate of the second source-side selection transistor SDTr2 directly from the selection gate line drive circuit 15b as the signal VSGS2<i>. Further, the signals VSGS2 and VSGD2 are supplied throughout a plurality of memory blocks MB as common signals.

The source line drive circuit 16, as shown in FIG. 7, outputs a signal VSL. The signal VSL is used for driving the source line SL.

The sense amplifier circuit 17, as shown in FIG. 7, charges the predetermined bit line BL up to predetermined voltage by outputting the signal VBL<i>, and then, determines the retained data of the memory transistor MTr in the memory string MS based upon a change of the voltage in the bit line BL. Further, the sense amplifier circuit 17 outputs the signal VBL<i> to the predetermined bit line BL according to the writing data.

The sequencer 18, as shown in FIG. 7, supplies control signals to the above-described circuits 11 to 17, and controls these circuits.

Once each of the row decoder circuits 19a and 19b, as shown in FIG. 7, are placed in one memory block MB. The row decoder circuit 19a inputs signals VCG1<i> to VCG4<i> to gates of the memory transistors MTr1 to MTr4 based upon the signals VCG1 to VCG4. Further, the row decoder circuit 19a selectively inputs the signal VSGSb<i> into a gate of the first source-side selection transistor SSTr1 in the second column of the memory unit MU based upon the signals BAD, VSGSb and SGOFF. Further, the row decoder circuit 19a selectively inputs the signal VSGDa into a gate of the first drain-side selection transistor SDTr1 of the memory unit MU in the first column based upon the signals BAD, VSGDa and SGOFF.

The row decoder circuit 19a includes a NAND circuit 19aa, an NOT circuit 19ab, a voltage conversion circuit 19ac, first transfer transistors Tra1 to Tra6 and second transfer transistors Trb1 and Trb2. The voltage conversion circuit 19ac generates a signal VSELa<i> based upon the signals BAD and RDEC received via the NAND circuit 19aa and the NOT circuit 19ab, and outputs the signal to gates of the first transfer transistors Tra1 to Tra6. Further, the voltage conversion circuit 19ac generates a signal VbSELa<i> based upon the signals BAD and RDEC, and outputs the signal to the second transistors Trb1 and Trb2.

The first transfer transistors Tra1 to Tra4 are connected between the word line circuit 13a and the word lines WL1 to WL4, respectively. The first transfer transistors Tra1 to Tra4 output signals VCG1<i> to VCG4<i> to the word lines WL1 to WL4 based upon the signals VCG1 to VCG4 and VSELa<i>. The first transfer transistor Tra5 is connected between the selection gate line drive circuit 15a and the first source-side selection gate line SGS1 of the memory unit MU in the second column. The first transfer transistor Tra5 outputs the signal VSGSb<i> to the first source-side selection gate line SGS1 of the memory unit MU in the second column based upon the signals VSGSb and VSELa<i>. The first transfer transistor Tra6 is connected between the selection gate line drive circuit 15a and the first drain-side selection gate line SGD1 of the memory unit MU in the first column. The first transfer transistor Tra6 outputs the signal VSGDa<i> to the first drain-side selection gate line SGD1 of the memory unit MU in the first column based upon the signals VSGDa and VSELa<i>.

The second transfer transistor Trb1 is connected between the selection gate line drive circuit 15a and the first source-side selection gate line SGS1 in the second column. The second transfer transistor Trb1 outputs the signal VSGSb<i> to the first source-side selection gate line SGS1 of the memory unit MU in the second column based upon the signals VSGOFF and VbSELa<i>. The second transfer transistor Trb2 is connected between the selection gate line drive circuit 15a and the drain-side selection gate line SGD of the memory unit MU in the first column. The second transfer transistor Trb2 outputs the signal VSGDa<i> to the first drain-side selection gate line SGD1 of the memory unit MU in the first column based upon the signals VSGOFF and VbSELa<i>.

The row decoder circuit 19b inputs signals VCG5<i> to VCG8<i> into the memory transistors MTr5 to MTr8 based upon the signals BAD and VCG5 to VCG8. Further, the row decoder circuit 19b selectively inputs the signal VSGSa<i> into a gate of the first source-side selection transistor SSTr1 of the memory unit MU in the first column based upon the signals BAD, VSGSa and SGOFF. Further, the row decoder circuit 19*b* selectively inputs the signal VSGDb<i> into a gate of the first drain-side selection transistor SDTr1 of the memory unit MU in the second column based upon the signals BAD, VSGDb and SGOFF.

The row decoder circuit 19*b* includes a NAND circuit 19*ba*, an NOT circuit 19*bb*, a voltage conversion circuit 19*bc*, first transfer transistors Trc1 to Trc7 and second transfer transistors Trd1 to Trd2. The voltage conversion circuit 19*bc* generates a signal VSELb<i> based upon the signals BAD and RDEC received via the NAND circuit 19*ba* and the NOT circuit 19*bb*, and outputs the signal to gates of the first transfer transistors Trc1 to Trc7. Further, the voltage conversion circuit 19*bc* generates a signal VbSELb<i> based upon the signals BAD and RDEC, and outputs the signal to gates of second transfer transistors Trd1 and Trd2.

The first transfer transistors Trc1 to Trc4 are connected between the word line drive circuit 13*b* and the word lines WL5 to WL8, respectively. The first transfer transistors Trc1 to Trc4 output signals VCG5<i> to VCG8<i> to the word lines WL5 to WL8 based upon the signals VCG5 to VCG8 and VSELb<i>. The first transfer transistor Trc5 is connected between the back gate line drive circuit 14 and the back gate line BG. The first transfer transistor Trc5 outputs the signal VBG<i> to the back gate line BG based upon the signals VBG and VSELb<i>. The first transfer transistor Trc6 is connected between the selection gate line drive circuit 15*b* and the first source-side selection gate line SGS1 of the memory unit MU in the first column. The first transfer transistor Trc6 outputs a signal VSGSa<i> to the first source-side selection gate line SGS1 of the memory unit in the first column based upon the signals VSGSa and VSELb<i>. The first transfer transistor Trc7 is connected between the selection gate line drive circuit 15*b* and the first drain-side selection gate line SGD1 of the memory unit MU in the second column. The first transfer transistor Trc7 outputs a signal VSGDb<i> to the first drain-side selection gate line SGD1 of the memory unity MU in the second column based upon the signals VSGDb and VSELb<i>.

The second transfer transistor Trd1 is connected between the selection gate line drive circuit 15*b* and the first source-side selection gate line SGS1 of the memory unit MU in the first column. The second transfer transistor Trd6 outputs the signal VSGSa<i> to the first source-side selection gate line SGS1 of the memory unit MU in the first column based upon the signals VSGOFF and the signal VbSELb<i>. The second transfer transistor Trd2 is connected between the selection gate line drive circuit 15*b* and the first drain-side selection gate line SGD1 of the memory unit MU in the second column. The second transfer transistor Trd2 outputs the signal VSGDb<i> to the first drain-side selection gate line SGD1 of the memory unit MU in the second column based upon the signals VSGOFF and VbSELb<i>.

Figure 8:
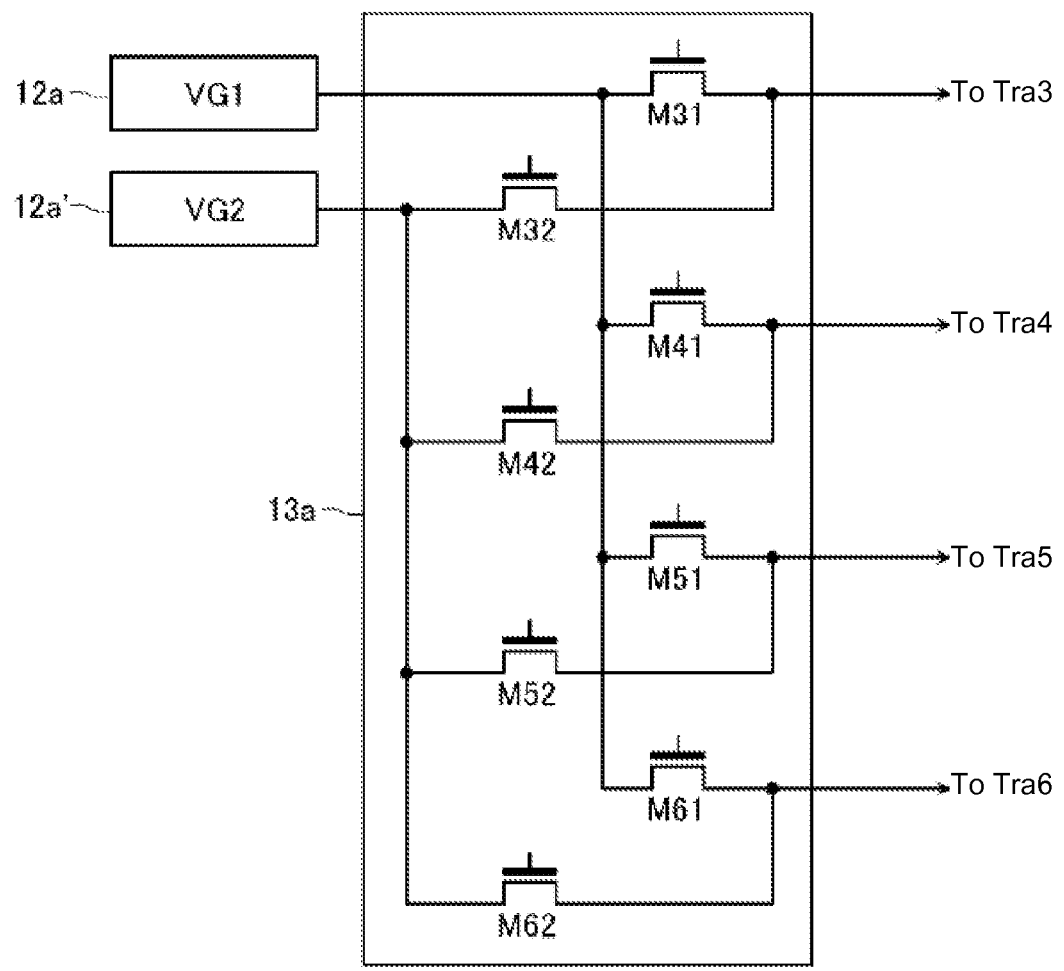
FIG. 8 is a circuit diagram showing a configuration of a word line drive circuit.

FIG. 8 is a circuit diagram showing the configuration of the word line drive circuit 13*a* in FIG. 7. Since the configuration of the word line drive circuit 13*b* is also the same, herein, only the configuration of the word line drive circuit 13*a* is explained herein.

The word line drive circuit 13*a* includes transfer transistors M31, M32, M41, M42, M51, M52, M61 and M62. As one example, when any one of the word lines WL1 to WL4 is selected, the transfer resistors M31, M41, M51 and M61 are conductive-controlled by the sequencer 18, and only any one of them selectively becomes in a conduction state (ON), and the others are all controlled to be in non-conduction state (OFF).

Similarly, the transfer transistors M32, M42, M52 and M62 are conductive-controlled by the sequencer 18, and only any one of them selectively becomes in a conduction state (ON), and the others are all controlled to be in non-conduction state (OFF). Further, only either one of two transfer transistors M31 and M32 that are connected to the first transfer transistor Tra3 in parallel alternatively becomes in a conduction state. The other transfer transistors M41, M42, M51, M52, M61 and M62 are also in the similar relationship.

Next, a circuit configuration of the voltage generating circuits 12*a* and 12*a*' of the first embodiment is explained with reference to FIG. 9. Furthermore, in the explanation below, it is explained that only the voltage generating circuits 12*a* and 12*a*' that supply voltage to the word lines WL have the configuration in FIG. 9. Other voltage generating circuits 12*b* and 12*c* may be configured with a charge pump circuit, and can adopt the configuration in FIG. 9. Further, it is possible that only the voltage generating circuit 12*a* includes the configuration in FIG. 9, and other voltage generating circuits including the voltage generating circuit 12*a*' can be configured with a charge pump circuit.

The voltage generating circuit 12*a* includes a charge pump circuit 124, a differential amplifier circuit 121 (a control circuit), PMOS transistors M6, M1 and M2, an NMOS transistor M3, diodes (also known as diode-connected transistors) D1 and D2, and resistors 122 and 123.

Although illustration is omitted, the charge pump circuit 124 comprises a plurality of series-connected diodes and a plurality of capacitors where one end is connected to a connection node of the plurality of diodes, respectively, as is known in the art. Clock signal CLK/CLK is provided to another end of these capacitors, respectively, and the reference voltage is raised to a desired raised voltage. The raised voltage is supplied to a source terminal of the PMOS transistor M6.

A drain of the PMOS transistor M6 is connected to a node N4. Further, a gate of the PMOS transistor M6 is controlled by an output signal of the differential amplifier circuit 121.

The diode D2 (the second diode) is connected between the node N4 and the node N1 by regarding the direction from the node N4 toward the node N1 as a forward direction. The diode D2 is formed with a diode-connected NMOS transistor, and its gate and drain are connected to the node N4.

Further, the diode D1 (first diode) is connected between the node N1 and the node N2 by regarding the direction from the node N1 toward the node N2 as a forward direction. The diode D1 is formed with a diode-connected PMOS transistor, and its gate and drain are connected to one end (node N2) of the resistor 122. The resistors 122 and 123 are series-connected between the node N2 and a ground terminal. The connection node between the resistors 122 and 123 is referred to as a node N5 hereafter.

The PMOS transistor M1 is connected so as to form a current pathway between an output terminal OUT and the node N3, and its gate is connected to the node N2 (a drain of the PMOS transistor constituting the diode D1). The PMOS transistor M1 includes a function to discharge voltage of the output terminal OUT when the voltage of the output terminal OUT becomes a predetermined value or greater.

Further, the PMOS transistor M2 is connected so as to form a current pathway between the node N3 and the ground terminal, and its gate is connected to the node N2. This PMOS transistor M2 is established for blocking the current pathway between the output terminal OUT and the ground terminal when the output terminal OUT is discharged and becomes a predetermined voltage. If there is no PMOS transistor M2 but only the PMOS transistor M1 exists, the current pathway between the output terminal OUT and the ground terminal is not completely blocked, and an electric current may flow. When the output terminal OUT becomes a predetermined voltage, the output terminal OUT and the node N1 becomes the same potential. The potential of the node N2 is smaller than that of the node N1 by the threshold voltage of the transistor D1, and this potential is inputted into a gate of the PMOS transistor M1. As a result, conditions where the PMOS transistor M1 is conductible are provided. Between the nodes N3 and N2, because the potential of the node N2 is higher, the PMOS transistor M2 is switched to the non-conduction state by inputting the node N2 into a gate of the PMOS transistor M2.

The NMOS transistor M3 is connected so as to form a current pathway between the output terminal OUT and the node N1, and its gate is connected to the node N4.

The differential amplifier circuit 121 differentially amplifies the voltage of the connection node N5 of the resistors 122 and 123 and the reference voltage VREF, and the differentially-amplified signal is output to the PMOS transistor M6.

Figure 10:
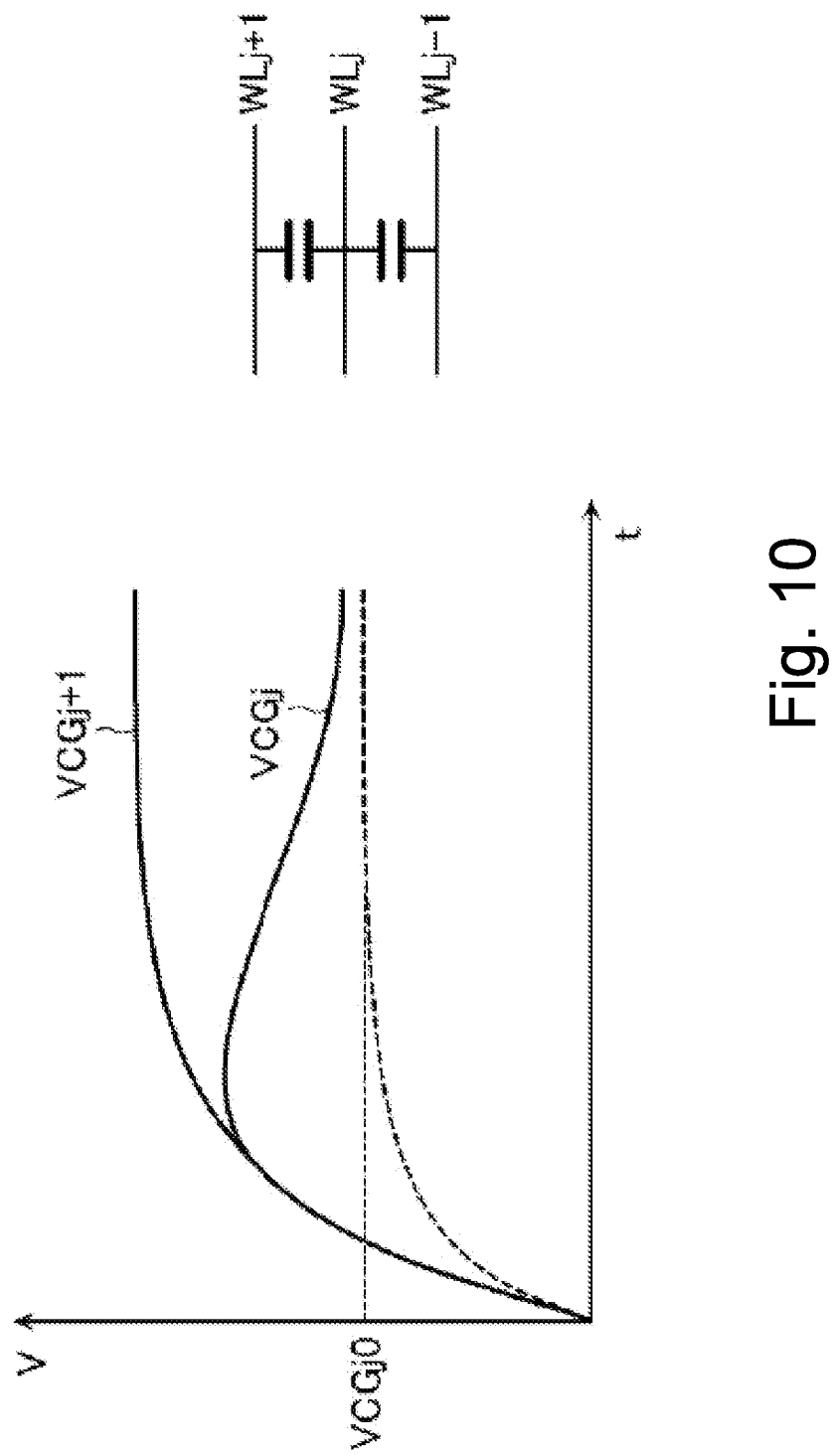
FIG. 10 depicts an example operation of a semiconductor memory device according to the first embodiment.

Next, operation of this voltage generating circuit 12a is explained with reference to FIG. 10 and FIG. 11. Herein, this is explained on the assumption that voltage is supplied to a selected word line WLj from the voltage generating circuit 12a, and voltage is supplied to non-selected word lines WLj+1 and j−1 from the voltage generating circuit 12a'. FIG. 10 shows a situation, for example, where the voltage VCGj of the selected word line WLj rises more than the desired value VCGj0 as a result of capacitive coupling due to voltage rising of the adjacent word lines WLj+1 and WLj−1. In this case, it requires a reasonable period of time until the voltage VCGj of the selected word line WLj converges into a desired value VCGj0. This leads to the reduction of the performance of the semiconductor memory device.

Figure 11:
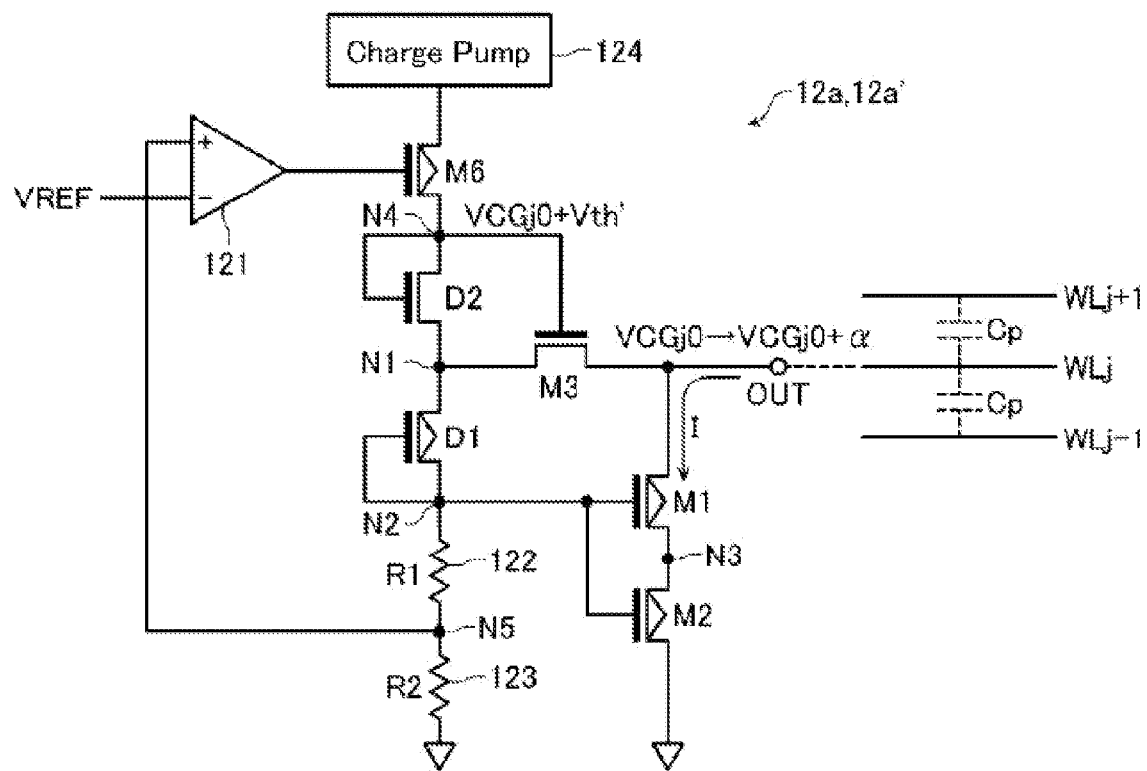
FIG. 11 depicts another example operation of a semiconductor memory device according to the first embodiment.

With reference to FIG. 11, operation of the voltage generating circuit 12a is explained. Now, the voltage VCGj of the word line WLj has a voltage value VCGj0, and it is assumed that this has been increased to a voltage value VCGj0+α due to capacitive coupling. In this case, since the voltage of the node N2 is VCGj0-Vth (provided, Vth is threshold voltage of the PMOS transistor constituting the diode D1), the PMOS transistor M1 is switched from a non-conduction state to a conduction state, and the PMOS transistor M2 is also switched from the non-conduction state to the conduction state. Then, the PMOS transistors M1 and M2 maintain the conduction state until the output node OUT is restored to the voltage value VCGj0. Thus, the transistor M1, as described above, functions to discharge the output terminal OUT when the potential of the output terminal OUT is increased due to the capacitive coupling, and to converge the potential of the output terminal OUT to any desired potential more quickly.

Furthermore, the differential amplifier 121 differentially amplifies the voltage of the node N5 that is generated by the electric current flowing from the node N1 to the diode D1 and the resistors 122 and 123 and the reference voltage VREF, outputs a differentially-amplified signal and controls the transistor M6, and this results in the adjustment of the potential of the node N1.

The transistor M3 is supplied with voltage from the charge pump circuit 124 via the PMOS transistor M6 and the diode D2 and is conducted, and is switched to a non-conduction state after the output terminal OUT is charged to the voltage VCGj0. After that, even if the output terminal OUT is increased from the voltage VCGj0 to VCGj0+α as described above, the transistor M3 does not become in a conduction state. This is because the node N4 is charged to the voltage VCGj0+Vth' (provided, Vth' is threshold voltage of the NMOS transistor constituting the diode D2), and the node N1 is charged to the voltage VCGj0.

Thus, according to the voltage generating circuit 12a of the first embodiment, even when the potential of the word line WL is increased due to the capacitive coupling, the output terminal OUT is discharged immediately, and the potential of the word line WL can be promptly converged to any desired potential. As a result, the performance of the semiconductor memory device can be improved.

[Second Embodiment]

The semiconductor memory device according to a second embodiment is explained with reference to FIG. 12. Overall configuration of this second embodiment is generally the same as that of the first embodiment, but configuration of the voltage generating circuits 12a and 12a' is different. Furthermore, in FIG. 12, the same constituent elements as those in the first embodiment are indicated by the same reference symbols, and repeated explanation is omitted.

Figure 9:
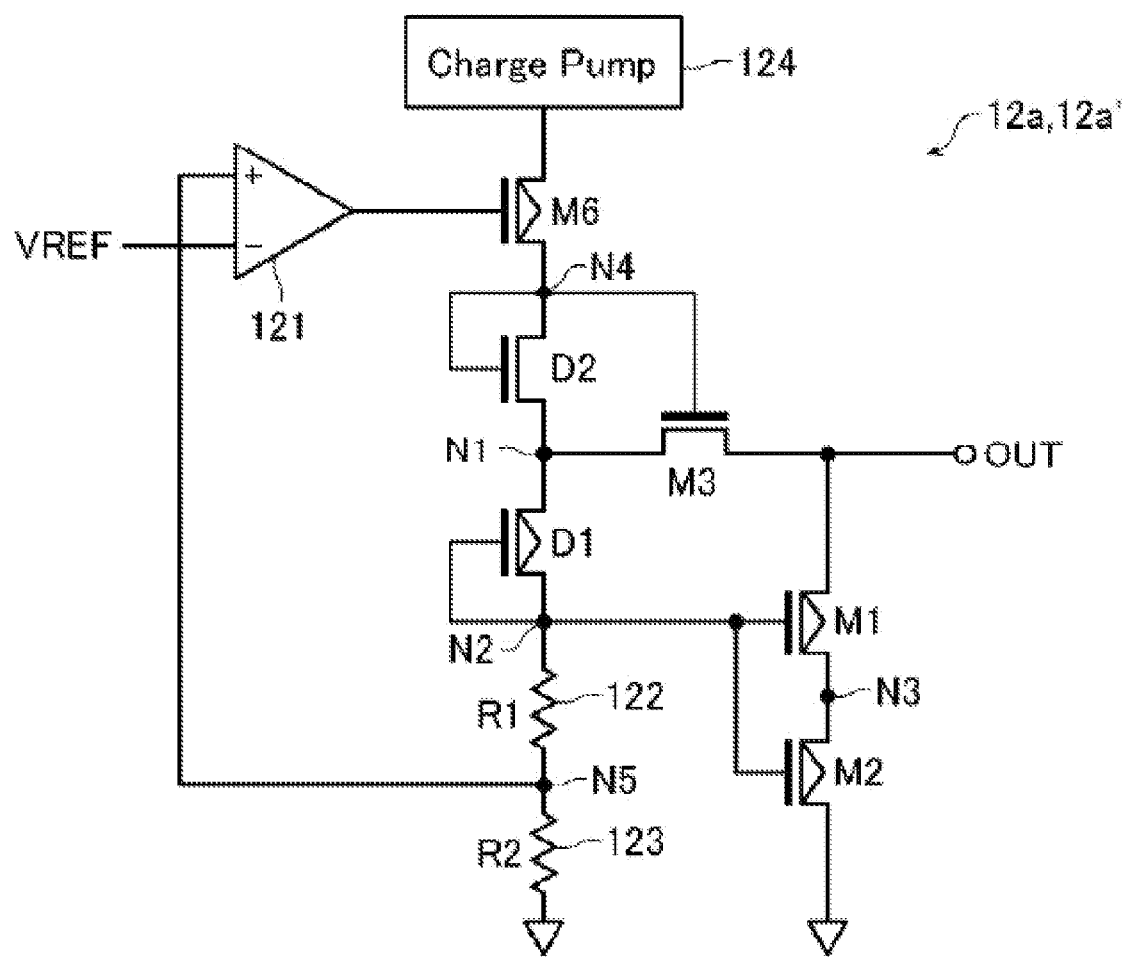
FIG. 9 is a circuit diagram showing a configuration of voltage generating circuits of the first embodiment.

The voltage generating circuits 12a and 12a' of the second embodiment include NMOS transistors M4 and M5 in addition to the constituent elements of the first embodiment (FIG. 9). The NMOS transistor M4 is connected so as to enable to form a current pathway (in other words, so as to enable to short-circuit) between the output terminal OUT of the voltage generating circuit 12 and the output terminal OUT' of the voltage generating circuit 12a'. Then, an enable signal ENB1 is provided to a gate of this NMOS transistor M4. The enable signal ENB1 is a signal that becomes, for example, "H" (e.g., a high level) during a predetermined period of time immediately after the reading operation is started.

On the other hand, the NMOS transistor M5 is connected between a drain of the PMOS transistor M2 and a ground terminal, and an enable signal ENB2 is provided to a gate. The enable signal ENB2 is a signal that becomes, for example, "H" during a predetermined period of time immediately after the enable signal ENB1 is restored to "L" (e.g., a low level) after it rises to "H" after the read operation is started. In other words, the PMOS transistors M1 and M2 in the second embodiment, after the enable signal ENB2 becomes "H", are transitioned to a state where the discharge operation is enabled.

Figure 12:
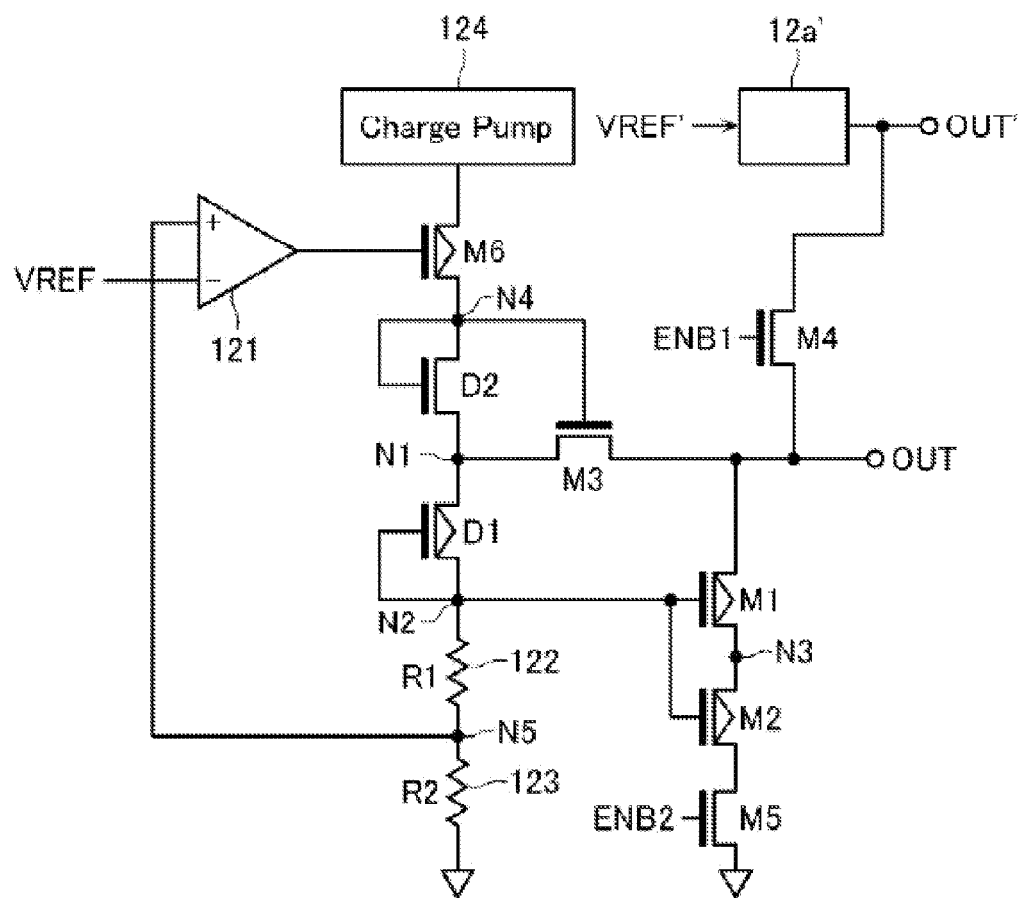
FIG. 12 is a circuit diagram showing a configuration of voltage generating circuits according to a second embodiment.
Figure 13:
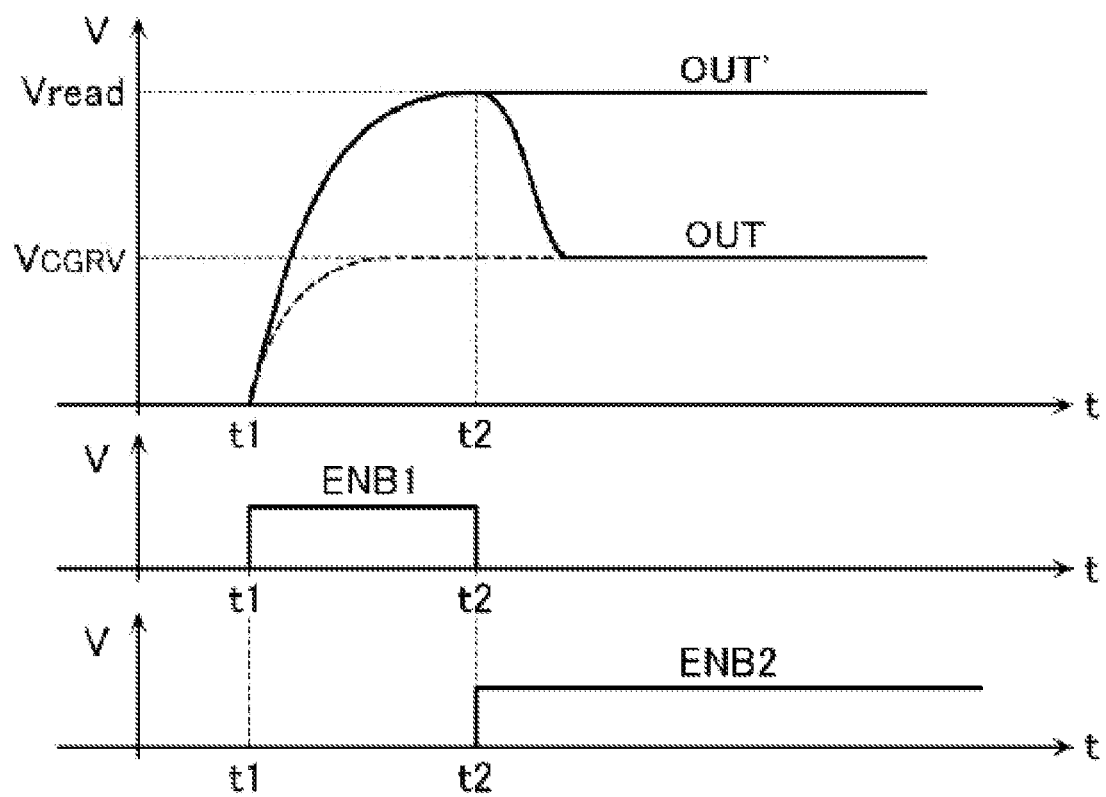
FIG. 13 depicts an example operation of a semiconductor memory device according to the second embodiment.

Next, the operation of the voltage generating circuits 12a and 12a' in this FIG. 12 is explained with reference to FIG. 13, as well. Herein, a case of the read operation is explained as an example. At time t1, the charge pump circuit 124 in the voltage generating circuits 12a and 12a' starts the operation. At the same time with this, the enable signal ENB1 rises to "H", and the NMOS transistor M4 is switched to a conducting state. As a result, the output terminal OUT of the voltage generating circuit 12a and the output terminal OUT' of the voltage generating circuit 12a' start rising. Then, since the NMOS transistor M4 is conductive and the output terminals OUT and OUT' are short-circuited, both output voltages rise to the read pass voltage $V_{read}$.

After that, at time t2, the enable signal ENB1 is restored to "L" again, and instead, the enable signal ENB2 rises to "H". The output terminals OUT and OUT' are electrically blocked (cutoff), and the output voltage is generated in the voltage generating circuits 12a and 12a', respectively. Specifically, the output terminal OUT is supplied with voltage in accordance with the reference voltage VREF set in the voltage generating circuit 12a (herein, read voltage $V_{CGRV}$), the output terminal OUT' is supplied with voltage in accordance with the reference voltage VREF' set in the voltage generating circuit 12a' (herein, read voltage $V_{read}$).

Further, the NMOS transistors M1 and M2 become in the operable state by causing the enable signal ENB2 to rise to "H", and this results in the discharge of the output voltage of the output terminal OUT toward the desired voltage VCGRV.

Even with this second embodiment, the effects similar to those of the first embodiment can be obtained. In addition, the potentials of the output terminals OUT and OUT' can be uniformed by establishing the NMOS transistor M4 including a function to connect between the output terminals of the voltage generating circuits 12a and 12a'. In the case of the first embodiment, it is not easy to accurately specify how much of the potential the selected word line WLj rises due to the capacitive coupling in the design stage. On the other hand, as in the second embodiment, it is the case of a format where the potential of the selected word line WLj is raised to the non-selected word lines WLj+1 and WLj−1, discharge capacity of the transistors M1 and M2 is ascertained ($V_{read}$−$V_{cgrv}$). Therefore, there is an advantage that the design including the size of the transistors M1 and M2 becomes easier.

[Others]

While certain embodiments have been described, these embodiments have been presented by way of example only; and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirits of the inventions. For example, in the above embodiments, the three-dimensional NAND type flash memory is explained as an example. However, the embodiments can be applied in a flat NAND type flash memory in which NAND cell units are formed on a surface of a semiconductor substrate. Additionally, commonly used insulating, semiconducting, and conducting materials have been described or indicated in the example embodiments, but, as well known in the art, various materials with similar properties to those materials described and indicated may be substituted.

The structure of the memory cell array is not limited to the above description. A memory cell array may be as disclosed in U.S. patent application Ser. No. 12/532,030, the entire contents of which are incorporated by reference herein.

What is claimed is:

1. A semiconductor memory device, comprising:
    a memory cell array including a plurality of memory cells;
    a first wiring connected to a memory cell; and
    a first voltage generating circuit having an output terminal and configured to generate a first voltage to be supplied to the first wiring through the output terminal when the memory cell is selected, the first voltage generating circuit including:
        a first diode that is connected between a first node and a second node;
        a first transistor that is connected between the output terminal and a third node, the first transistor having a gate connected to the second node;
        a second transistor that is connected between the third node and ground, the second transistor having a gate connected to the second node;
        a third transistor that is connected between the output terminal and the first node, the third transistor having a gate connected to a fourth node;
        a second diode that is connected between the first node and the fourth node; and
        a charge pump circuit configured to supply a voltage to the fourth node.

2. The semiconductor memory device of claim of 1, wherein the first transistor and the second transistor have a channel of a first conductivity type, and the third transistor has a channel of a second conductivity type.

3. The semiconductor memory device of claim 1, further comprising:
    a second voltage generating circuit configured to generate a second voltage, which is supplied to the first wiring when the memory cell is not selected, the second voltage having a lower voltage level than the first voltage.

4. The semiconductor memory device of claim 3, further comprising:
    a fourth transistor that is connected between the output terminal of the first voltage generating circuit and an output terminal of the second voltage generating circuit.

5. The semiconductor memory device of claim 4, further comprising:
    a fifth transistor that is connected between the second transistor and a ground terminal; wherein
    the fourth transistor is supplied with a first enable signal, and the fifth transistor is supplied with a second enable signal.

6. The semiconductor memory device of claim 1, further comprising:
    a sixth transistor that is connected between the fourth node and the charge pump circuit, wherein
    a gate of the sixth transistor is connected to a control circuit that controls a conductivity of the sixth transistor according to a comparison of a voltage at a fifth node that is between the second node and ground with a reference voltage.

7. The semiconductor memory device of claim 6, further comprising:
    a second voltage generating circuit configured to generate a second voltage, which is supplied to the first wiring when the memory cell is not selected, the second voltage having a voltage level that is lower than the first voltage;
    a fourth transistor that is connected between the output terminal of the first voltage generating circuit and an output terminal of the second voltage generating circuit;
    a fifth transistor that is connected between the second transistor and a ground terminal; wherein
    the fourth transistor is supplied with a first enable signal, and the fifth transistor is supplied with a second enable signal.

8. The semiconductor memory device of claim 7, further comprising:
    an address decoder configured to output an address signal indicating a selected memory cell;
    a row decoder configured to select the first wiring from a plurality of wirings connected to the plurality of memory cells according to the address signal; and
    a driver circuit configured to supply the first voltage to the row decoder.

9. The semiconductor memory device of claim 1, wherein the memory cell array is planar.

10. A semiconductor memory device, comprising:
    a memory cell array including a plurality of memory units arranged in a plurality of memory blocks, the memory units comprising a plurality of memory cells connected in series;
    a plurality of word lines, each word line connected to a different memory cell in a memory unit;

an address decoder configured to output an address signal indicating a selected memory cell;

a row decoder configured to select a word line corresponding to the address signal;

a word line driver configured to supply a first voltage to a selected word line and a second voltage to an unselected word line;

a first voltage generating circuit connected to the word line driver and configured to generate the first voltage; and a second voltage generating circuit connected to the word line driver and configured to generate the second voltage;

wherein the first voltage generating circuit includes:

a first diode connected between a first node and a second node;

a first transistor connected between an output terminal and a third node, the first transistor having a gate connected to the second node;

a second transistor connected between the third node and ground, the second transistor having a gate connected to the second node;

a third transistor connected between the output terminal and the first node, the third transistor having a gate connected to a fourth node;

a second diode that is connected between the first node and the fourth node; and a charge pump circuit configured to supply voltage to the fourth node.

11. The semiconductor memory device of claim 10, further comprising:

a sixth transistor that is connected between the fourth node and the charge pump circuit, wherein a gate of the sixth transistor is connected to a control circuit that controls a conductivity of the sixth transistor according to a comparison of a voltage at a fifth node that is between the second node and ground with a reference voltage.

12. The semiconductor memory device of claim 10, further comprising:

a fourth transistor connected between the output terminal of the first voltage generating circuit and an output terminal of the second voltage generating circuit; and a fifth transistor connected between the second transistor and a ground terminal, wherein a first enable signal is supplied to switch the fourth transistor to a conductive state for a specified period of time, and second enable signal is supplied to switch the fifth transistor to a conductive state after the lapse of the specified period of time.

13. The semiconductor memory device of claim 12, further comprising:

a sixth transistor that is connected between the fourth node and the charge pump circuit, wherein a gate of the sixth transistor is connected to a control circuit that controls a conductivity of the sixth transistor according to a comparison of a voltage at a fifth node that is between the second node and ground with a reference voltage.

14. The semiconductor memory device of claim 10, wherein the first transistor and the second transistor have a channel of a first conductivity type, and the third transistor has a channel of a second conductivity type.

15. The semiconductor memory device of claim 10, wherein the first diode is a p-channel metal-oxide-semiconductor field-effect transistor with a drain connected to a gate, and the second diode is an n-channel metal oxide semiconductor-field effect transistor with a drain connected to a gate.

16. The semiconductor memory device of claim 10, wherein the first voltage generating circuit and the second voltage generating circuit have a same internal configuration.

17. A semiconductor memory device, comprising:

a memory cell array including a plurality of memory units arranged in a plurality of memory blocks, the memory units comprising a plurality of memory cells connected in series;

a plurality of word lines, each word line connected to a different memory cell in a memory unit;

an address decoder configured to output an address signal indicating a selected memory cell;

a row decoder configured to select a word line corresponding to the address signal;

a word line driver configured to supply a first voltage to a selected word line and a second voltage to an unselected word line;

a first voltage generating circuit connected to the word line driver and configured to generate the first voltage; and a second voltage generating circuit connected to the word line driver and configured to generate the second voltage;

wherein the first voltage generating circuit includes:

a first diode connected between a first node and a second node;

a first transistor connected between an output terminal and a third node, the first transistor having a gate connected to the second node;

a second transistor connected between the third node and ground, the second transistor having a gate connected to the second node;

a third transistor connected between the output terminal and the first node, the third transistor having a gate connected to a fourth node;

a second diode that is connected between the first node and the fourth node; and a charge pump circuit configured to supply voltage to the fourth node;

a fourth transistor connected between the output terminal of the first voltage generating circuit and an output node of the second voltage generating circuit;

a fifth transistor connected between the second transistor and a ground terminal; and a sixth transistor connected between the fourth node and the charge pump circuit, wherein a gate of the sixth transistor is connected to a control circuit that controls a conductivity of the sixth transistor according to a comparison of a voltage at a fifth node that is between the second node and ground with a reference voltage, and a first enable signal is supplied to switch the fourth transistor to a conductive state for a specified period of time, and second enable signal is supplied to switch the fifth transistor to a conductive state after the lapse of the specified period of time.

18. The semiconductor memory device of claim 17, wherein the memory cell array is planar.

19. The semiconductor memory device of claim 17, wherein the first transistor and the second transistor have a p-type channel, and the third transistor has an n-type channel; and the first diode is a p-channel transistor with a drain connected to a gate, and the second diode is an n-channel transistor with a drain connected to a gate.

20. The semiconductor memory device of claim 17, wherein the first voltage generating circuit and the second voltage generating circuit have the same internal configuration.

* * * * *